(12) United States Patent
Jeon et al.

(10) Patent No.: US 12,268,008 B2
(45) Date of Patent: Apr. 1, 2025

(54) 3D NON-VOLATILE MEMORY, OPERATING METHOD OF THE SAME AND MANUFACTURING METHOD OF THE SAME

(71) Applicant: Korea Advanced Institute of Science and Technology, Daejeon (KR)

(72) Inventors: Sanghun Jeon, Daejeon (KR); Youngin Goh, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 553 days.

(21) Appl. No.: 17/743,314

(22) Filed: May 12, 2022

(65) Prior Publication Data
US 2023/0051142 A1 Feb. 16, 2023

(30) Foreign Application Priority Data
Aug. 9, 2021 (KR) .......................... 10-2021-0104281

(51) Int. Cl.
*H10B 53/20* (2023.01)
(52) U.S. Cl.
CPC ..................... *H10B 53/20* (2023.02)
(58) Field of Classification Search
CPC .... H01L 29/40111; H10B 53/20; H10B 51/20

USPC ........................................................ 257/211
See application file for complete search history.

(56) References Cited

U.S. PATENT DOCUMENTS

| | | | | |
|---|---|---|---|---|
| 2021/0375930 A1* | 12/2021 | Lu | .......................... | H01L 21/383 |
| 2022/0020775 A1* | 1/2022 | Yang | ....................... | H10B 51/20 |
| 2022/0231049 A1* | 7/2022 | Lin | .......................... | H10B 51/20 |

FOREIGN PATENT DOCUMENTS

| KR | 10-2013-0141586 | 12/2013 |
|---|---|---|
| KR | 10-2021-0028060 | 3/2021 |

* cited by examiner

*Primary Examiner* — Igwe U Anya
(74) *Attorney, Agent, or Firm* — Christensen O'Connor Johnson Kindness PLLC

(57) ABSTRACT

Disclosed are a 3D non-volatile memory, an operating method thereof, and a manufacturing method thereof. The 3D non-volatile memory includes a bit line formed to extend in a vertical direction and horizontal structures contacting the bit line while being formed to extend in a horizontal direction and being space in the vertical direction. Each of the horizontal structures includes a ferroelectric layer contacting the bit line, a middle metal layer surrounded by the ferroelectric layer, a dielectric layer surrounded by the middle metal layer, and a word line surrounded by the dielectric layer.

18 Claims, 23 Drawing Sheets

$$C_{DE} : C_{FE} = \frac{\varepsilon_{DE}(a_2^2 + 4a_2h_2)}{d_{DE}} : \frac{\varepsilon_{FE}(h_1^2)}{d_{FE}}$$

3D NON-VOLATILE MEMORY, OPERATING METHOD OF THE SAME AND MANUFACTURING METHOD OF THE SAME

CROSS-REFERENCE TO RELATED APPLICATIONS

This application claims priority under 35 U.S.C. § 119 to Korean Patent Application No. 10-2021-0104281 filed on Aug. 9, 2021, in the Korean Intellectual Property Office, the disclosure of which is incorporated by reference herein in its entirety.

BACKGROUND

Embodiments of the present disclosure described herein relate to a 3D non-volatile memory, and more particularly, relate to a 3D non-volatile memory for improving a memory operating speed, memory reliability, and memory durability.

A non-volatile memory may be a memory that electrically controls input/output of data, and may store information even after power is lost.

In particular, among non-volatile memories, a ferroelectric memory (FeRAM) using a ferroelectric layer is considered as a next-generation non-volatile memory because the FeRAM consumes less power and has faster read and program speeds than a silicon-based flash memory.

However, because the FeRAM additionally requires a selector or diode to control a leakage current when a cell array is formed, the FeRAM has a problem that density is reduced, a problem that an operating voltage is significantly applied to the selector or diode and thus the operating voltage for a memory operation is increased, and a problem that a process is complicated. Moreover, the FeRAM may have poor durability when the FeRAM is implemented by using a ferroelectric tunnel junction.

Accordingly, to solve the described problems, there is a need for a new 3D non-volatile memory.

SUMMARY

Embodiments of the present disclosure provide a 3D non-volatile memory having a structure including a charge fixing layer implementing a self-rectifying function to improve density and an operating voltage, to simplify a process, and to improve durability, an operating method thereof, and a manufacturing method thereof.

Embodiments of the present disclosure provide a 3D non-volatile memory having a structure in which an area where a ferroelectric layer contacts a middle metal layer and an area where a dielectric layer contacts a word line are adjusted to satisfy the condition that capacitance of a ferroelectric layer is smaller than capacitance of a dielectric layer for the purpose of improving memory reliability.

However, the technical problems to be solved by the present disclosure are not limited to the above problems, and may be variously expanded without departing from the technical spirit and scope of the present disclosure.

According to an embodiment, a three-dimensional (3D) non-volatile memory includes a bit line formed to extend in a vertical direction and horizontal structures contacting the bit line while being formed to extend in a horizontal direction and being space in the vertical direction. Each of the horizontal structures includes a ferroelectric layer contacting the bit line, a middle metal layer surrounded by the ferroelectric layer, a dielectric layer surrounded by the middle metal layer, and a word line surrounded by the dielectric layer.

According to an aspect, the 3D non-volatile memory further includes a charge fixing layer for implementing a self-rectifying function by forming an imprint field while being positioned in one of a junction portion with the ferroelectric layer or a junction portion of the dielectric layer.

According to another aspect, the charge fixing layer includes at least one of $SiO_2$, $SiN_x$, $Ta_2O_5$, $Nb_2O_5$, $HfO_2$, $ZrO_2$, $TiO_2$, or $V_2O_5$ when being formed to fix a positive charge.

According to still another aspect, the charge fixing layer includes at least one of $Al_2O_3$, $AlN$, $Ga_2O_3$, $TiO_2$, $Ta_2O_5$, $Nb_2O_5$, or $HfO_2$ when being formed to fix a negative charge.

According to yet another aspect, the charge fixing layer is positioned on a junction portion where the ferroelectric layer contacts the bit line when the charge fixing layer aligns and shifts a dipole of the ferroelectric layer in a negative voltage direction while being formed to fix a positive charge.

According to yet another aspect, the charge fixing layer is positioned on one of a junction portion where the ferroelectric layer contacts the middle metal layer, a junction portion where the dielectric layer contacts the middle metal layer, or a junction portion where the dielectric layer contacts the word line, when the charge fixing layer aligns and shifts a dipole of the ferroelectric layer in a negative voltage direction while being formed to fix a negative charge.

According to yet another aspect, the charge fixing layer is positioned on one of a junction portion where the ferroelectric layer contacts the middle metal layer, a junction portion where the dielectric layer contacts the middle metal layer, or a junction portion where the dielectric layer contacts the word line, when the charge fixing layer aligns and shifts a dipole of the ferroelectric layer in a positive voltage direction while being formed to fix a positive charge.

According to yet another aspect, the charge fixing layer is positioned on a junction portion where the ferroelectric layer contacts the bit line, when the charge fixing layer aligns and shifts a dipole of the ferroelectric layer in a positive voltage direction while being formed to fix a negative charge.

According to yet another aspect, the bit line and the ferroelectric layer, and the dielectric layer and the word line have a structure that satisfies a condition that capacitance of the ferroelectric layer is smaller than capacitance of the dielectric layer.

According to yet another aspect, an area where the ferroelectric layer contacts the middle metal layer and an area where the dielectric layer contacts the word line are adjusted to satisfy the condition that the capacitance of the ferroelectric layer is smaller than the capacitance of the dielectric layer.

According to yet another aspect, the area where the ferroelectric layer contacts the middle metal layer and the area where the dielectric layer contacts the word line are adjusted independently of each other depending on a characteristic in which contacting the ferroelectric layer with the middle metal layer and contacting the dielectric layer with the word line do not structurally affect each other.

According to an embodiment, a program operating method of a 3D non-volatile memory including a bit line formed to extend in a vertical direction, horizontal structures contacting the bit line while being formed to extend in a horizontal direction and being space in the vertical direction, each of the horizontal structures including a ferroelectric layer contacting the bit line, a middle metal layer surrounded by the ferroelectric layer, a dielectric layer surrounded by the middle metal layer, and a word line surrounded by the dielectric layer, and a charge fixing layer positioned in one of a junction portion with the ferroelectric layer or a junction portion of the dielectric layer includes implementing a self-rectifying function by aligning a dipole of the ferroelectric layer of a target memory cell in one direction with an imprint field formed by the charge fixing layer and performing a program operation on the target memory cell depending on the self-rectifying function.

According to an embodiment, a method for manufacturing a 3D non-volatile memory includes preparing a semiconductor structure including interlayer insulating layers and sacrificial layers that are formed to extend in a horizontal direction and alternately stacked in a vertical direction, forming a bit line trench in the semiconductor structure to extend the bit line trench in the vertical direction, forming and extending a bit line in the bit line trench, forming a working trench for forming a horizontal structure in the semiconductor structure to extend the working trench in the vertical direction, removing the sacrificial layers through the working trench, forming ferroelectric layers to cover top surfaces, bottom surfaces, and sidewalls of spaces where the sacrificial layers are removed, forming middle metal layers to cover top surfaces, bottom surfaces, and sidewalls of inner spaces of the ferroelectric layers, forming dielectric layers to cover top surfaces, bottom surfaces, and sidewalls of inner spaces of the middle metal layers, and forming word lines to fill inner spaces of the dielectric layers.

According to an aspect, the method for manufacturing the 3D non-volatile memory further includes one of forming a charge fixing layer for implementing a self-rectifying function by forming an imprint field to cover the sidewalls of the spaces from which the sacrificial layers are removed, forming the charge fixing layer to cover the sidewalls of the inner spaces of the ferroelectric layers, forming the charge fixing layer to cover the sidewalls of the inner spaces of the middle metal layers, or forming the charge fixing layer to cover the sidewalls of the inner spaces of the dielectric layers.

According to an embodiment, a 3D non-volatile memory includes a bit line formed to extend in one direction, ferroelectric layers that are in contact with the bit line, middle metal layers that are in contact with the ferroelectric layers, respectively, dielectric layers that are in contact with the middle metal layers, respectively, and word lines that are in contact with the dielectric layers, respectively.

According to an aspect, the bit line and the ferroelectric layers, and the dielectric layers and the word lines have a structure for satisfying a condition that capacitance of each of the ferroelectric layers is smaller than capacitance of each of the dielectric layers.

According to another aspect, areas where the ferroelectric layers respectively contact the middle metal layers and areas where the dielectric layers respectively contact the word lines are adjusted to satisfy the condition that the capacitance of each of the ferroelectric layers is smaller than the capacitance of each of the dielectric layers.

According to still another aspect, the areas where the ferroelectric layers respectively contact the middle metal layers and the areas where the dielectric layers respectively contact the word lines are adjusted independently of each other depending on a characteristic in which respectively contacting the ferroelectric layers with the middle metal layers and respectively contacting the dielectric layers with the word lines do not structurally affect each other.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
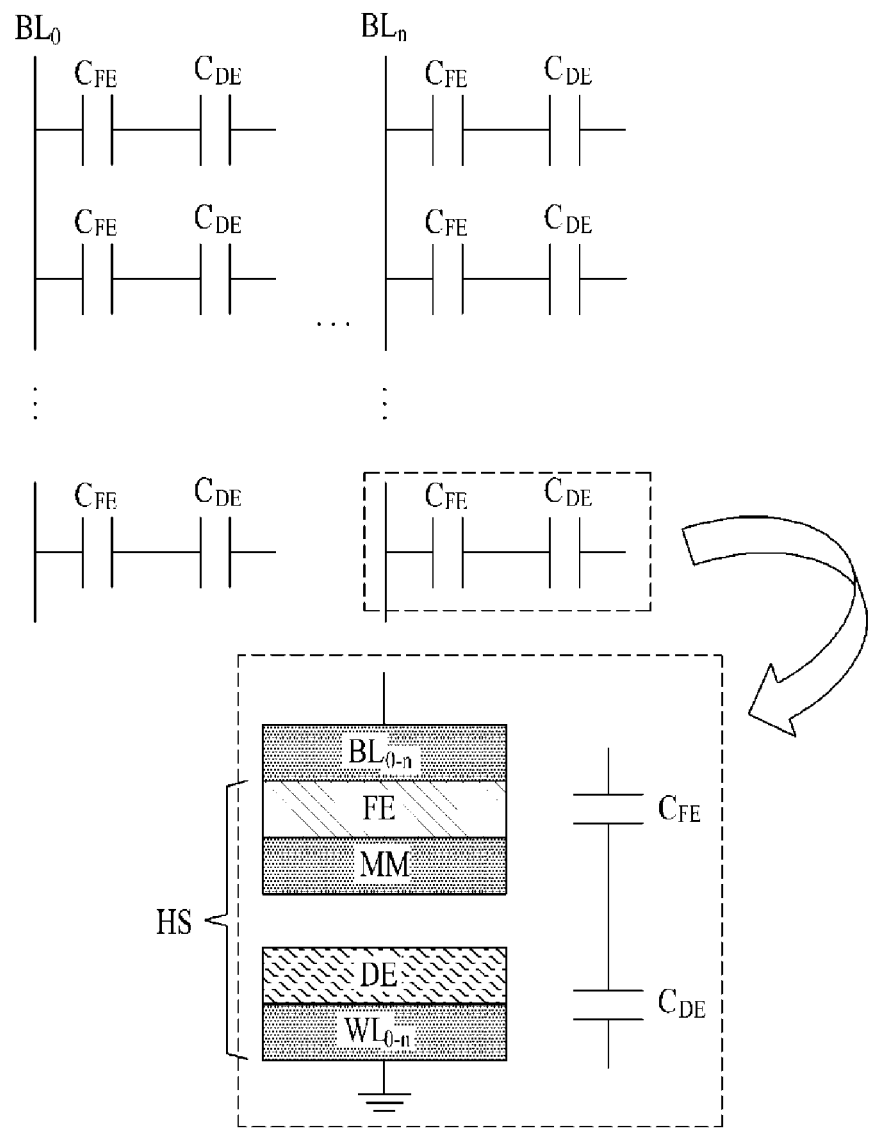
FIG. 1A is a conceptual diagram for describing a 3D non-volatile memory, according to an embodiment.

Hereinafter, a description will be given in detail for embodiments of the present disclosure with reference to the following drawings. However, the present disclosure are not limited or restricted by the embodiments. Further, the same reference signs/numerals in the drawings denote the same members.

Furthermore, the terminologies used herein are used to properly express the embodiments of the present disclosure, and may be changed according to the intentions of a viewer or the manager or the custom in the field to which the present disclosure pertains. Therefore, definition of the terminologies should be made according to the overall disclosure set forth herein. For example, in the specification, the singular forms include plural forms unless particularly mentioned. Furthermore, the terminologies "comprises" and/or "comprising" used herein does not exclude presence or addition of one or more other components, steps, operations, and/or elements in addition to the aforementioned components, steps, operations, and/or elements. Moreover, the terminologies such as first, second, etc. and the like used in this specification to describe various regions, directions, shapes, and the like, these areas, directions, and shapes should not be limited by these terminologies. These terminologies are only used to distinguish one region, direction, or shape from another region, direction, or shape. Accordingly, a portion referred to as the first part in an embodiment may be referred to as the second part in another embodiment.

Moreover, it should be understood that various embodiments of the present disclosure are not necessarily mutually exclusive although being different from each other. For example, specific shapes, structures, and characteristics described herein may be implemented in other embodiments without departing from the spirit and scope of the present disclosure in relation to one embodiment. Besides, it should be understood that the location, arrangement, or configuration of individual components in each of presented categories of an embodiment may be changed without departing from the spirit and scope of the present disclosure.

Hereinafter, a 3D nonvolatile memory, an operating method thereof, and a manufacturing method thereof according to embodiments will be described in detail with reference to the drawings. The 3D non-volatile memory described below improves operating speed and durability through a structure that satisfies a condition that capacitance of a ferroelectric layer is smaller than capacitance of a dielectric layer, based on a bitline metal-ferroelectric-barrier metal-insulator-wordline metal (MFMIM) structure. Furthermore, in the 3D non-volatile memory, a separate diode or selector may be omitted through a structure including a charge fixing layer that implements a self-rectifying function by forming an imprint field, thereby improving integration.

Figure 1B:
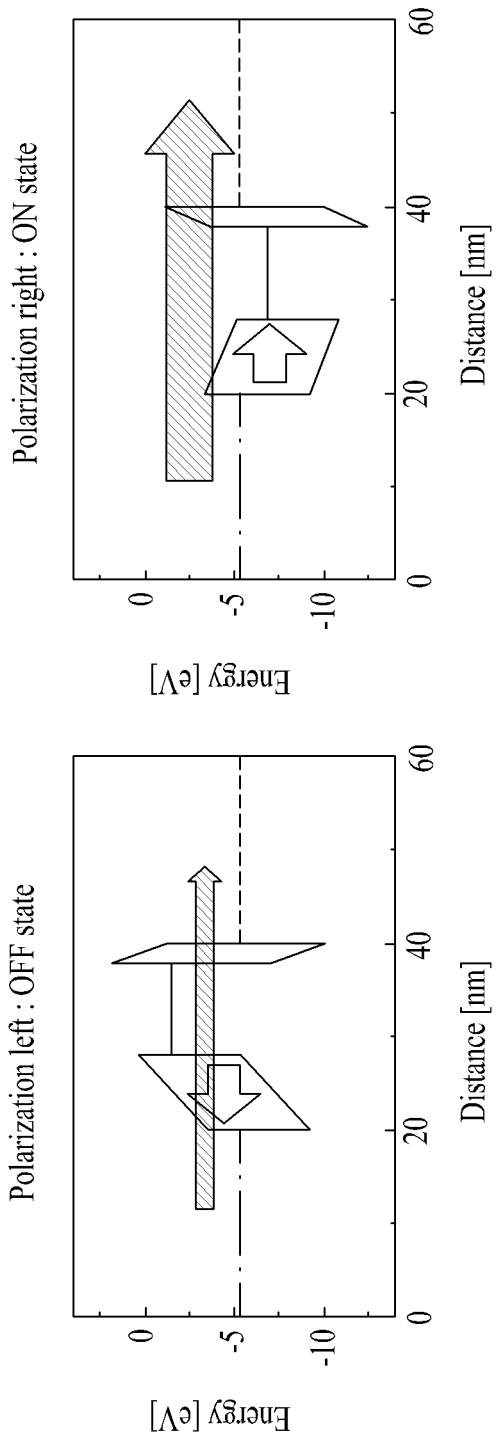
FIG. 1B is a conceptual diagram for describing an operation principle of a 3D non-volatile memory, according to an embodiment.

FIG. 1A is a conceptual diagram for describing a 3D non-volatile memory, according to an embodiment. FIG. 1B is a conceptual diagram for describing an operation principle of a 3D non-volatile memory, according to an embodiment.

According to an embodiment, a 3D non-volatile memory described below may be a ferroelectric tunnel junction (FTJ) memory that performs memory operations (a program operation, a read operation, and an erase operation) by using the polarization phenomenon of a dipole in an ferroelectric layer FE, which is a memory cell, by forming memory cells with ferroelectric layers FE.

Referring to FIG. 1A, the 3D non-volatile memory according to an embodiment may include bit line BL0-$n$ and a horizontal structure HS connected perpendicular to the bit line BL0-$n$.

Here, the horizontal structure HS is composed of the ferroelectric layers FE, middle metal layers MM that respectively contact the ferroelectric layers FE, dielectric layers DE that respectively contact the middle metal layers MM, and the word lines WL0-$n$ that respectively contact the dielectric layers DE. Accordingly, the 3D non-volatile memory may include memory cells formed by the ferroelectric layers FE. Accordingly, the 3D non-volatile memory may include memory cells based on the ferroelectric layers FE. In this way, the 3D non-volatile memory may store a data value by using changes in tunneling resistance (changes in a tunneling current value) due to the polarization phenomenon of a dipole in each of the ferroelectric layers FE.

Hereinafter, components included in each of the horizontal structures HS are described.

Each of the ferroelectric layers FE expresses and maintains an alignment state (a polarization state) of a dipole by a voltage difference generated by a voltage applied to a bit line BL0-$n$ and each of the word lines WL0-$n$, thereby implementing a function of a memory cell indicating data values (indicating data values that are changed to have multiple values due to a change in tunneling resistance according to changes in a polarization state). For example, as illustrated in FIG. 1B, each of the ferroelectric layers FE may represent a value of data by determining an on state or an off state by using an alignment direction (a polarization direction) of a dipole. FIG. 1B shows an off-state where the polarization direction is left and an on-state where the polarization direction is right, but this is only an example.

To this end, each of the ferroelectric layers FE may be formed of a material having an orthorhombic crystal structure in which polarization occurs. For example, each of the ferroelectric layers FE may include at least one of HfOx, HfOx doped with at least one material of Al, Zr, or Si, PZT(Pb(Zr, Ti)O$_3$), PTO(PbTiO$_3$), SBT(SrBi$_2$Ti2O$_3$), BLT (Bi(La, Ti)O$_3$), PLZT(Pb(La, Zr)TiO$_3$), BST(Bi(Sr, Ti)O$_3$), barium titanate (BaTiO$_3$), P(VDF-TrFE), PVDF, AlOx, ZnOx, TiOx, TaOx, or InOx. However, each of the ferroelectric layers FE is not limited thereto. In addition to the materials described above, each of the ferroelectric layers FE may be formed of various ferroelectric materials capable of causing the polarization phenomenon of a dipole.

Each of the middle metal layers MM may be a component for distinguishing and separating the ferroelectric layers FE and the dielectric layers DE such that the ferroelectric layers FE and the dielectric layers DE do not structurally affect each other. Each of the middle metal layers MM may be formed of a conductive material (e.g., a conductive material including at least one selected from a doped semiconductor (e.g., doped silicon), metal (e.g., tungsten W, copper Cu, aluminum Al, titanium Ti, tantalum Ta, molybdenum Mo, ruthenium Ru, gold Au, or the like), or conductive metal nitride (e.g., titanium nitride, tantalum nitride, or the like) such that a voltage difference is generated in memory cells, which are formed by the ferroelectric layers FE, by a voltage applied through the bit lines BL0-$n$ and each of the word lines WL0-$n$. However, the middle metal layer MM is not limited thereto, and may include at least one of all metal materials capable of being formed by using ALD in addition to the above-described metal material.

Each of the dielectric layers DE may be formed of at least one material of a silicon oxide film, a nitride film, an aluminum oxide film, a hafnium oxide film, a silicon-doped hafnium oxide (Si:HfO$_2$) film, an aluminum-doped hafnium oxide (Al:HfO$_2$) film, a lanthanum-doped hafnium oxide (La:HfO$_2$) film, a yttrium-doped hafnium oxide (Y:HfO$_2$) film, a strontium-doped hafnium oxide (Sr:HfO$_2$) film, a hafnium oxynitride film, a zinc oxide film, a lanthanum oxide film, and a hafnium silicon oxide film, a hafnium zirconium oxide film, a barium titanate (BaTiO$_3$) film, a lead titanate (PbTiO$_3$) film, a calcium titanate (CaTiO$_3$) film, a potassium niobate (KNbO$_3$) film, a lead zirconate titanate (PZT) film, a SrBi2Ta2O9 film, or a bismuth ferrite (BFO) film.

Each of the word lines WL0-$n$ may be formed of a conductive material such that a voltage for generating a voltage difference in memory cells, which are formed by the ferroelectric layers FE, is applied. Examples of the conductive material forming the word lines WL0-$n$ are the same as those of the middle metal layers MM described above, and thus a detailed description thereof will be omitted to avoid redundancy.

The bit line BL0-$n$ may be a wiring shared by the horizontal structures HS. Like the middle metal layers MM and/or the word lines WL0-$n$ described above, the bit line BL0-$n$ may be formed of a conductive material such that a voltage is applied to generate a voltage difference in the memory cells formed by the ferroelectric layers FE. Examples of the conductive material forming the bit line BL0-$n$ are the same as those of the middle metal layers MM described above, and thus a detailed description thereof will be omitted to avoid redundancy.

As such, because the ferroelectric layers FE and the dielectric layers DE are distinguished and separated by each of the middle metal layers MM (because each of the ferroelectric layers FE and each of the dielectric layers DE are bonded to each other while not being adjacent to each other), contacting each of the ferroelectric layers FE with each of the middle metal layers MM does not structurally affect contacting each of the dielectric layers DE with each of the word lines WL0-$n$ in the 3D non-volatile memory of an MFMIM structure. Accordingly, areas where the ferroelectric layers FE respectively contact the middle metal layers MM and areas where the dielectric layers DE respectively contact the word lines WL0-$n$ may be adjusted and determined independently of each other in consideration of the above-described characteristics.

As such, the areas where the ferroelectric layers FE respectively contact the middle metal layers MM and the areas where the dielectric layers DE respectively contact the word lines WL0-$n$ may be adjusted and determined to satisfy a condition that capacitance $C_{FE}$ of each of the ferroelectric layers FE is smaller than capacitance $C_{DE}$ of each of the dielectric layers DE. Accordingly, because the condition that the capacitance $C_{FE}$ is smaller than the capacitance $C_{DE}$ of the dielectric layer DE is satisfied, a voltage drop in the dielectric layer DE due to an applied voltage may be prevented, thereby improving memory reliability and durability.

As described above, it is described that the areas where the ferroelectric layers FE respectively contact the middle metal layers MM are adjusted and determined with respect to the capacitance $C_{FE}$ of each of the ferroelectric layers FE, but is not limited thereto. The value of the capacitance $C_{FE}$ of each of the ferroelectric layers FE may be adjusted by adjusting and determining an area where each of the ferroelectric layers FE contacts the bit line BL0-$n$ (the capacitance $C_{FE}$ of each of the ferroelectric layers FE may be adjusted to have a smaller value than the capacitance $C_{DE}$ of each of the dielectric layers DE).

That is, the 3D non-volatile memory according to an embodiment has a structure (a structure for adjusting a capacitance ratio between the capacitance $C_{FE}$ of each of the ferroelectric layers FE and the capacitance $C_{DE}$ of each of the dielectric layers DE) that satisfies the condition that the capacitance $C_{FE}$ of each of the ferroelectric layers FE is smaller than the capacitance $C_{DE}$ of each of the dielectric layers DE, thereby improving memory reliability and durability. A detailed description thereof will be described with reference to FIG. 3.

Moreover, the 3D non-volatile memory according to an embodiment may further include a charge fixing layer FCL disposed on one of a junction portion with each of the ferroelectric layers FE or a junction portion with each of the dielectric layers DE, thereby implementing a self-rectifying function by forming an imprint field through the charge fixing layer FCL. The detailed description thereof will be described with reference to FIGS. 5A to 5B.

As described above, the basic structure and concept of the 3D non-volatile memory according to an embodiment have been described. Hereinafter, a detailed structure, an operating method, and a manufacturing method according to an embodiment will be described.

Figure 2A:
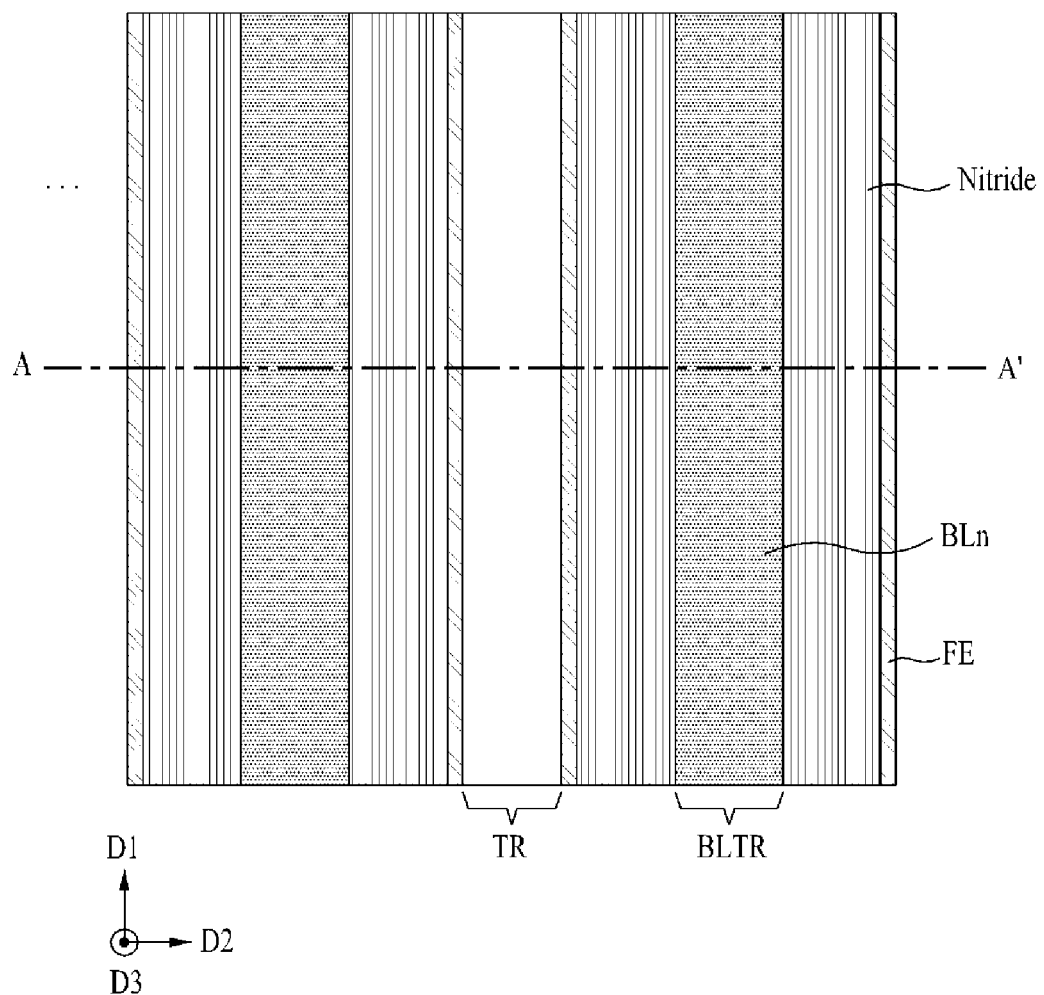
FIG. 2A is a plan view illustrating a 3D non-volatile memory, according to an embodiment.
Figure 2B:
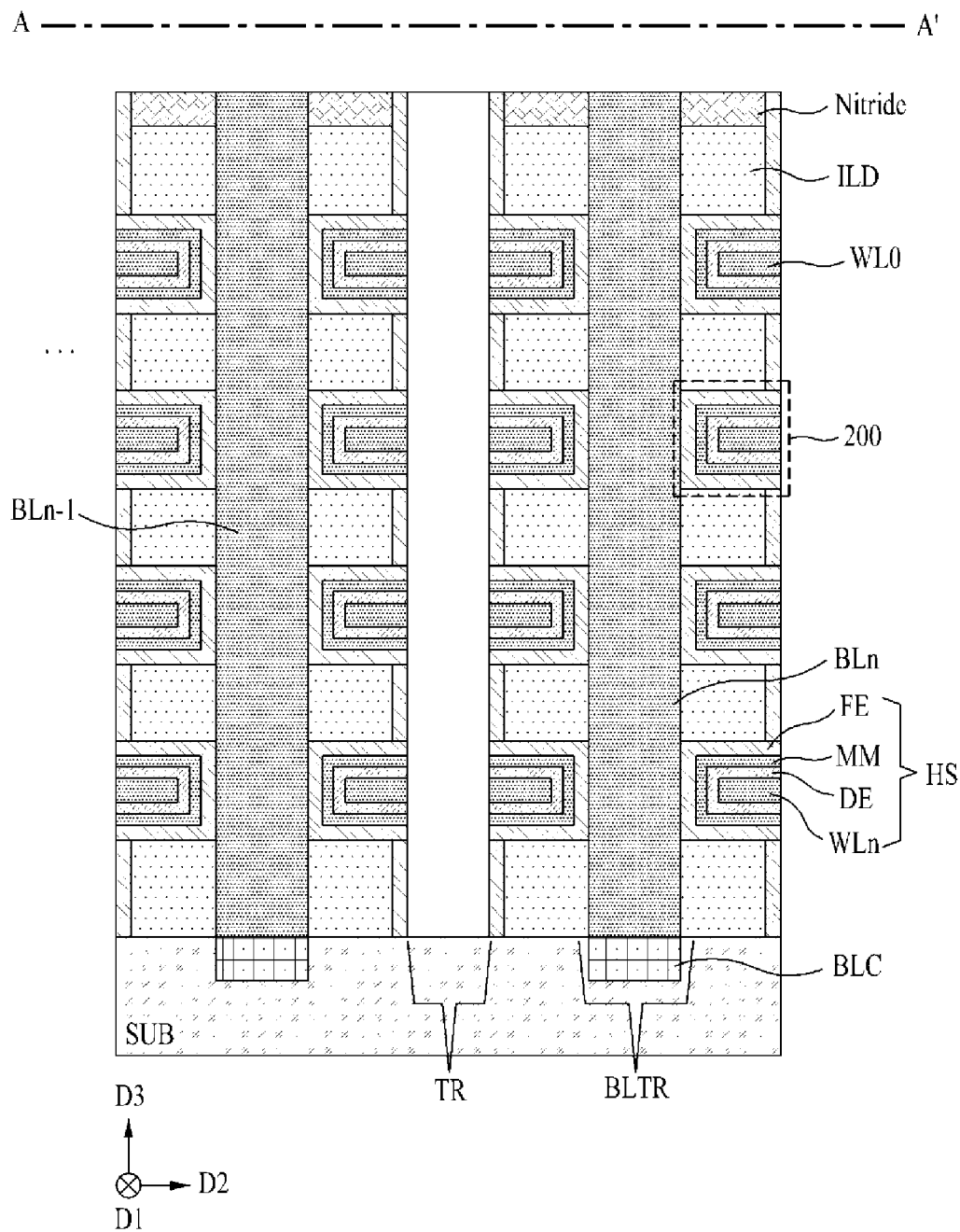
FIG. 2B is a front cross-sectional view illustrating a 3D non-volatile memory, according to an embodiment, and is a cross-section taken along line A-A' of FIG. 2A.
Figure 3:
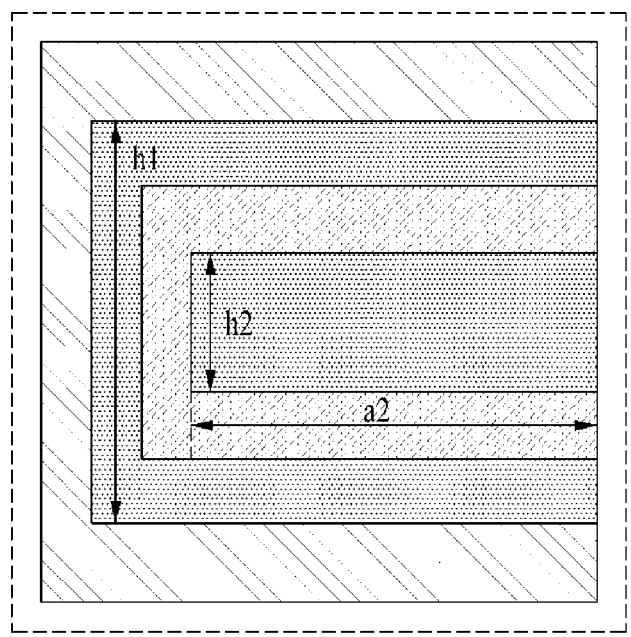
FIG. 3 is a diagram for describing a condition that a physical structure is changed in a 3D non-volatile memory, according to an embodiment.

FIG. 2A is a plan view illustrating a 3D non-volatile memory, according to an embodiment. FIG. 2B is a front cross-sectional view illustrating a 3D non-volatile memory, according to an embodiment, and is a cross-section taken along line A-A' of FIG. 2A. FIG. 3 is a diagram for describing a condition that a physical structure is changed in a 3D non-volatile memory, according to an embodiment.

Referring to FIGS. 2A and 2B, a 3D non-volatile memory may include a bit line BLn and the horizontal structures HS disposed on a substrate SUB.

The substrate SUB may be a semiconductor substrate such as a silicon substrate, a silicon-germanium substrate, a germanium substrate, or a monocrystalline epitaxial layer grown on a monocrystalline silicon substrate. A bit line contact BLC may be formed in a region corresponding to a location of the bit line BLn in the substrate SUB.

The horizontal structures HS and interlayer insulating layers ILD may be alternately stacked on the substrate SUB. Each of the horizontal structures HS and each of the interlayer insulating layers ILD may be alternately positioned in a third direction D3 while extending in a first direction D1 and being spaced from each other. At this time, the horizontal structures HS may be positioned spaced from each other in a second direction D2 and other horizontal structures connected to another bit line adjacent to the corresponding bit line BLn.

The bit line BLn may be formed to extend in a vertical direction (e.g., the third direction D3) in a bit line trench BLTR penetrating the interlayer insulating layers ILD on the substrate SUB so as to be shared with the corresponding horizontal structures HS. The bit line BLn may be formed of a conductive material (e.g., a conductive material including at least one selected from a doped semiconductor (e.g., doped silicon), metal (e.g., tungsten W, copper Cu, aluminum Al, titanium Ti, tantalum Ta, molybdenum Mo, ruthenium Ru, gold Au, or the like), or conductive metal nitride (e.g., titanium nitride, tantalum nitride, or the like) such that a voltage for generating a voltage difference is applied in memory cells formed by ferroelectric layers included in each of the horizontal structures HS.

Each of the horizontal structures HS may include the ferroelectric layer FE, the middle metal layer MM, the dielectric layer DE, and a word line WLn.

The ferroelectric layer FE, which is included in each of the horizontal structures HS and which contacts the bit line BLn, expresses and maintains an alignment state (a polarization state) of a dipole by a voltage difference generated by a voltage applied to a bit line BLn and a word line WLn to implement a function of a memory cell, thereby implementing a function of a memory cell indicating data values (indicating data values that are changed to have multiple values due to a change in tunneling resistance according to changes in a polarization state). To this end, the ferroelectric layer FE may be formed of a material having an orthorhombic crystal structure in which polarization occurs. For example, the ferroelectric layer FE may include at least one of HfOx, HfOx doped with at least one material of Al, Zr, or Si, PZT(Pb(Zr, Ti)O$_3$), PTO(PbTiO$_3$), SBT(SrBi$_2$Ti$_2$O$_3$), BLT(Bi(La, Ti)O$_3$), PLZT(Pb(La, Zr)TiO$_3$), BST(Bi(Sr, Ti)O$_3$), barium titanate (BaTiO$_3$), P(VDF-TrFE), PVDF, AlOx, ZnOx, TiOx, TaOx, or InOx. However, each of the ferroelectric layers FE is not limited thereto. In addition to the materials described above, each of the ferroelectric layers FE may be formed of various ferroelectric materials capable of causing the polarization phenomenon of a dipole.

The middle metal layer MM surrounded by the ferroelectric layer FE while being included in each of the horizontal structures HS may be a component for distinguishing and separating the ferroelectric layer FE and the dielectric layer DE such that the ferroelectric layer FE and the dielectric layer DE do not structurally affect each other. In addition, the middle metal layer MM may be formed of a conductive material such that a voltage difference is generated in a memory cell formed by the ferroelectric layer FE constitutes by a voltage applied through the bit line BLn and the word line WLn. Examples of the conductive material forming the middle metal layer MM are the same as those of the bit line BL described above, and thus a detailed description thereof will be omitted to avoid redundancy.

The dielectric layer DE surrounded by the middle metal layer MM while being included in each of the horizontal structures HS may be formed of at least one material of a silicon oxide film, a nitride film, an aluminum oxide film, a hafnium oxide film, a silicon-doped hafnium oxide (Si:$HfO_2$) film, an aluminum-doped hafnium oxide (Al:$HfO_2$) film, a lanthanum-doped hafnium oxide (La:$HfO_2$) film, a yttrium-doped hafnium oxide (Y:$HfO_2$) film, a strontium-doped hafnium oxide (Sr:$HfO_2$) film, a hafnium oxynitride film, a zinc oxide film, a lanthanum oxide film, and a hafnium silicon oxide film, a hafnium zirconium oxide film, a barium titanate ($BaTiO_3$) film, a lead titanate ($PbTiO_3$) film, a calcium titanate ($CaTiO_3$) film, a potassium niobate ($KNbO_3$) film, a lead zirconate titanate (PZT) film, a SrBi2Ta2O9 film, or a bismuth ferrite (BFO) film.

The word line WLn surrounded by the dielectric layer DE while being included in each of the horizontal structures HS may be formed of a conductive material such that a voltage is applied to generate a voltage difference in a memory cell formed by the ferroelectric layer FE. Examples of the conductive material forming the word line WLn are the same as those of the bit line BLn and the middle metal layers MM described above, and thus a detailed description thereof will be omitted to avoid redundancy.

As such, because the ferroelectric layer FE and the dielectric layer DE are distinguished and separated by the middle metal layer MM (because the ferroelectric layer FE and the dielectric layer DE are bonded to each other while not being adjacent to each other), contacting the ferroelectric layer FE with the middle metal layer MM does not structurally affect contacting the dielectric layer DE with the word line WLn in the 3D non-volatile memory of an MFMIM structure. Accordingly, an area where the ferroelectric layer FE contacts the middle metal layer MM and an area where the dielectric layer DE contacts the word line WLn may be adjusted and determined independently of each other in consideration of the above-described characteristics.

As such, the area where the ferroelectric layer FE contacts the middle metal layer MM and the area where the dielectric layer DE contacts the word line WLn may be adjusted and determined to satisfy the condition that the capacitance $C_{FE}$ of the ferroelectric layer FE is smaller than the capacitance $C_{DE}$ of the dielectric layer DE. Accordingly, because the condition that the capacitance $C_{FE}$ is smaller than the capacitance $C_{DE}$ of the dielectric layer DE is satisfied, a voltage drop in the dielectric layer DE due to an applied voltage may be prevented, thereby improving memory reliability and durability.

In this regard, referring to FIG. 3 that is a view from enlarging a region 200 shown in FIG. 2B, the capacitance $C_{FE}$ of the ferroelectric layer FE is proportional to a height $h_1$, which is an area where the ferroelectric layer FE contacts the middle metal layer MM, as shown in Equation of FIG. 3. The capacitance $C_{DE}$ of the dielectric layer DE is proportional to a height $h_2$ and a length a2, which are an area where the dielectric layer DE contacts the word line WLn, as shown in Equation of FIG. 3. Accordingly, the area where the ferroelectric layer FE contacts the middle metal layer MM and the area where the dielectric layer DE contacts the word line WLn may be adjusted and determined independently of each other in consideration of the above-described characteristics, thereby satisfying the condition ($C_{FE}<C_{DE}$) that the capacitance $C_{FE}$ of the ferroelectric layer FE is smaller than the capacitance $C_{DE}$ of the dielectric layer DE.

That is, to satisfy the condition ($C_{FE}<C_{DE}$) that the capacitance $C_{FE}$ of the ferroelectric layer FE is smaller than the capacitance $C_{DE}$ of the dielectric layer DE, the 3D non-volatile memory according to an embodiment has a structure (a structure capable of adjusting a capacitance ratio between the capacitance $C_{FE}$ of the ferroelectric layers FE and the capacitance $C_{DE}$ of the dielectric layers DE) in which an area (height h1) where the ferroelectric layer FE contacts the middle metal layer MM and an area (height h2 and length a2) where the dielectric layer DE contacts the word line WLn are adjusted and determined independently of each other, thereby improving the reliability and durability of a memory.

As described above, it is described that the area (height h1) where the ferroelectric layer FE contacts the middle metal layer MM is adjusted and determined with respect to the capacitance $C_{FE}$ of the ferroelectric layer FE, but is not limited thereto. The value of the capacitance $C_{FE}$ of the ferroelectric layer FE may be adjusted by adjusting and determining the area where the ferroelectric layer FE contacts the bit line BLn (the capacitance $C_{FE}$ of the ferroelectric layer FE may be adjusted to have a value smaller than the capacitance $C_{DE}$ of the dielectric layer DE).

Figure 4A:
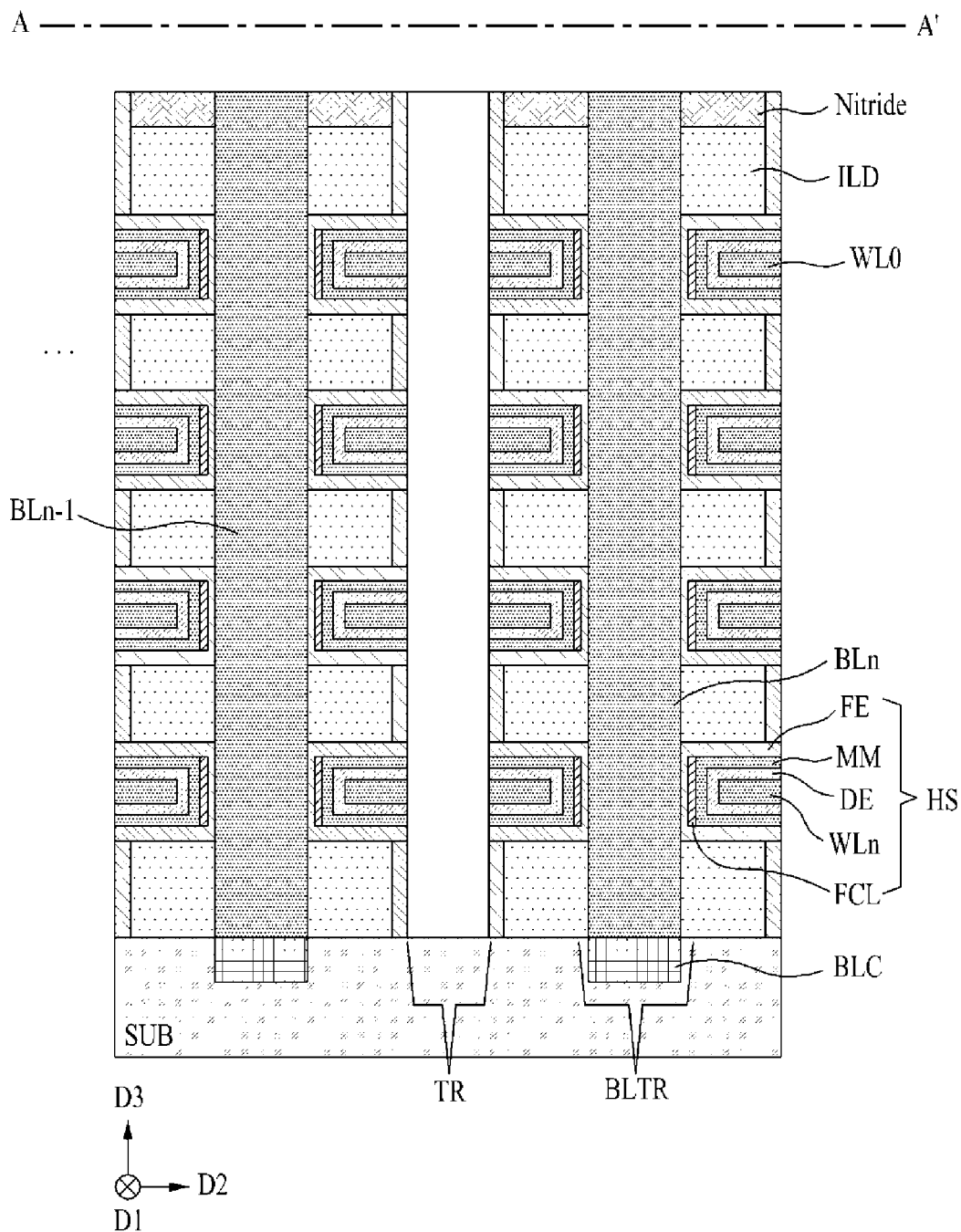
FIG. 4A is a front cross-sectional view illustrating a 3D non-volatile memory, according to another embodiment.
Figure 4B:
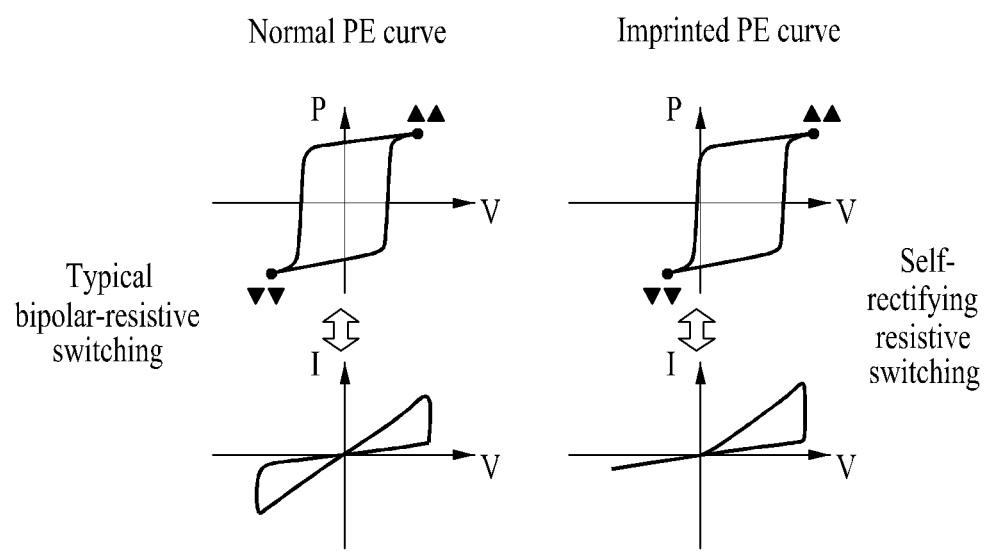
FIG. 4B is a diagram for describing a difference between a 3D non-volatile memory and a conventional memory, according to another embodiment.
Figure 5A:
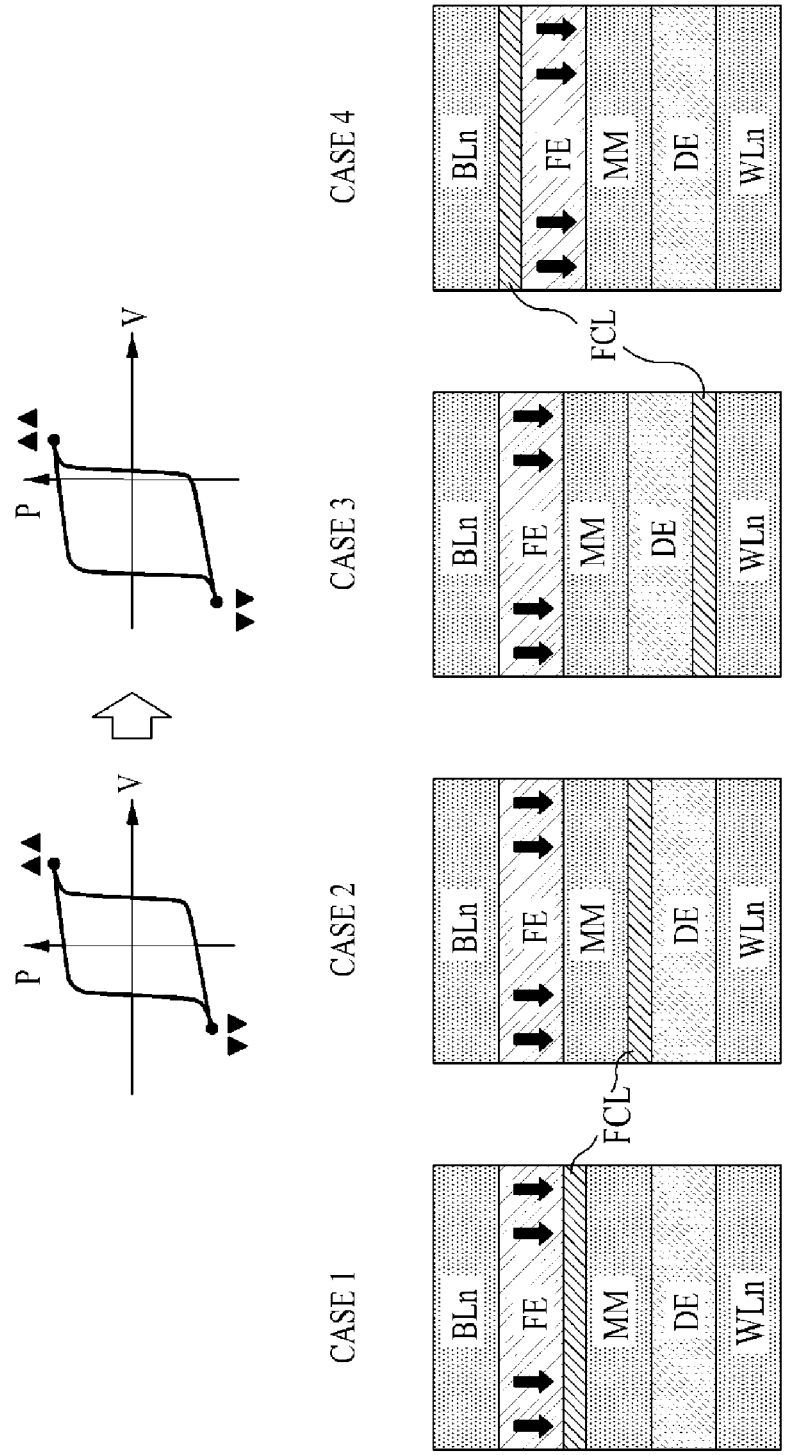
FIGS. 5A to 5B are conceptual diagrams for describing a charge fixing layer included in a 3D non-volatile memory, according to another embodiment.
Figure 5B:
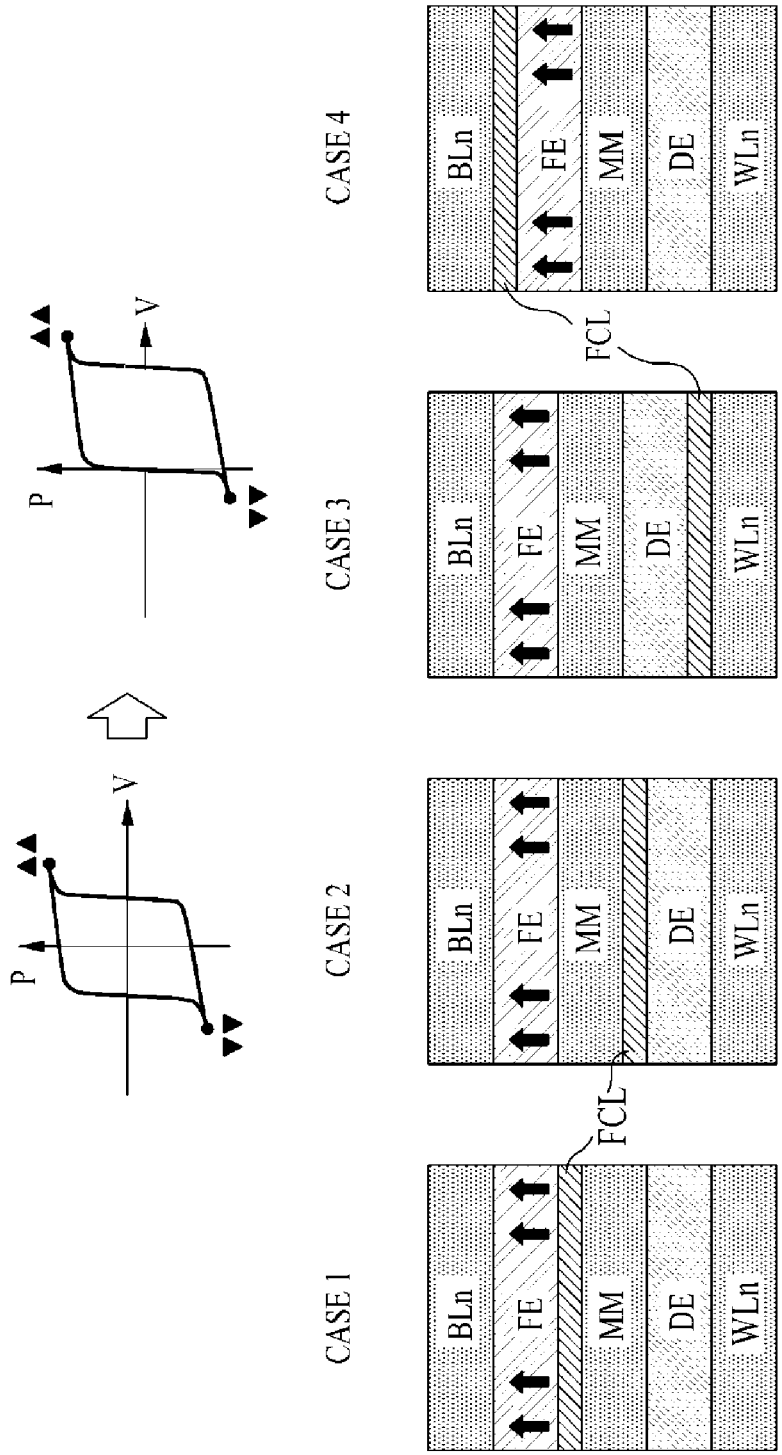

FIG. 4A is a front cross-sectional view illustrating a 3D non-volatile memory, according to another embodiment. FIG. 4B is a diagram for describing a difference between a 3D non-volatile memory and a conventional memory, according to another embodiment. FIGS. 5A to 5B are conceptual diagrams for describing a charge fixing layer included in a 3D non-volatile memory, according to another embodiment.

Referring to FIG. 4A, a 3D non-volatile memory according to another embodiment is different from the 3D non-volatile memory according to an embodiment described with reference to FIGS. 2A to 2B and 3 in that the 3D non-volatile memory according to another embodiment has the same structure as the 3D non-volatile memory described with reference to FIGS. 2A to 2B and 3 but further includes a charge fixing layer FCL. Accordingly, only the charge fixing layer FCL will be described below.

When a conventional FTJ memory is applied to a cross-point array structure, a leak current may be generated in memory cells upon selecting a memory cell for a memory operation. To solve this problem, a selector or diode having a rectifying function of generating a current in one direction is required to control the leakage current. However, when a selector or diode is included, an operating voltage is significantly applied to the selector and the diode, thereby increasing the operating voltage of a memory and reducing the degree of integration of the memory.

On the other hand, the 3D non-volatile memory according to another embodiment further includes the charge fixing layer FCL, which implements a self-rectifying function by forming an imprint field. In this way, the 3D non-volatile memory may align and move a dipole of the ferroelectric layer FE in a negative voltage direction or a positive voltage direction by using the charge fixing layer FCL (shifting a hysteresis curve in the negative or positive voltage direction on an x-axis in parallel). For example, as shown in FIG. 4B, when the charge fixing layer FCL implements a self-rectifying function to align and shift the dipole of the ferroelectric layer FE in the positive voltage direction, a current may flow in only one voltage direction unlike the conventional memory where currents flows in both voltage directions. Accordingly, the 3D non-volatile memory including the charge fixing layer FCL may generate a resistance change by a voltage in only one direction (resistance change is not generated and maintained by a voltage in a different direction).

Accordingly, the 3D non-volatile memory according to another embodiment may align and shift a dipole of the ferroelectric layer FE in the negative voltage direction and may implement a self-rectifying function as if aligning and shifting the dipole of the ferroelectric layer FE in the positive voltage direction, thereby solving a new problem of the conventional FTJ memory (the operating voltage is significantly applied to the selector and diode when a selector or diode is included, thereby increasing an operating voltage and reducing the degree of integration).

FIG. 4A illustrates that the charge fixing layer FCL is disposed on a junction portion where the ferroelectric layer FE contacts the middle metal layer MM so as to align and shift a dipole of the ferroelectric layer FE in the positive voltage direction while being formed to fix a positive charge. However, it is not limited thereto. The charge fixing layer FCL may be positioned in various locations depending on a charge formed to fix the positive charge and a voltage direction in which dipoles are to be aligned.

In this regard, referring to FIG. 5A, when the charge fixing layer FCL aligns and shifts a dipole of the ferroelectric layer FE in the negative voltage direction while being formed to fix a negative charge, the charge fixing layer FCL may be disposed in one of a junction portion where the ferroelectric layer FE contacts the middle metal layer MM as illustrated in CASE 1, a junction portion where the dielectric layer DE contacts the middle metal layer MM as illustrated in CASE 2, or a junction portion where the dielectric layer DE contacts the word line WLn as illustrated in CASE 3. When the charge fixing layer FCL aligns and shifts the dipole of the ferroelectric layer FE in the negative voltage direction while being formed to fix a positive charge, the charge fixing layer FCL may be positioned on a junction portion where the ferroelectric layer FE contacts the bit line BLn, as illustrated in CASE 4.

In addition, as illustrated in FIG. 5B, when the charge fixing layer FCL aligns and shifts a dipole of the ferroelectric layer FE in the positive voltage direction while being formed to fix a positive charge, the charge fixing layer FCL may be disposed in one of a junction portion where the ferroelectric layer FE contacts the middle metal layer MM as illustrated in CASE 1, a junction portion where the dielectric layer DE contacts the middle metal layer MM as illustrated in CASE 2, or a junction portion where the dielectric layer DE contacts the word line WLn as illustrated in CASE 3. When the charge fixing layer FCL aligns and shifts the dipole of the ferroelectric layer FE in the positive voltage direction while being formed to fix a negative charge, the charge fixing layer FCL may be positioned on a junction portion where the ferroelectric layer FE contacts the bit line BLn, as illustrated in CASE 4.

At this time, when the charge fixing layer FCL is formed to fix a positive charge, the charge fixing layer FCL may include at least one of $SiO_2$, SiNx, $Ta_2O_5$, $Nb_2O_5$, $HfO_2$, $ZrO_2$, $TiO_2$, and $V_2O_5$. When the charge fixing layer FCL is formed to fix a negative charge, the charge fixing layer FCL may include at least one of $Al_2O_3$, AlN, $Ga_2O_3$, $TiO_2$, $Ta_2O_5$, $Nb_2O_5$, and $HfO_2$.

As such, as the 3D non-volatile memory of the structure includes the charge fixing layer FCL, the 3D non-volatile memory may perform a program operation based on a self-rectifying function. This will be described in detail below.

Figure 6:
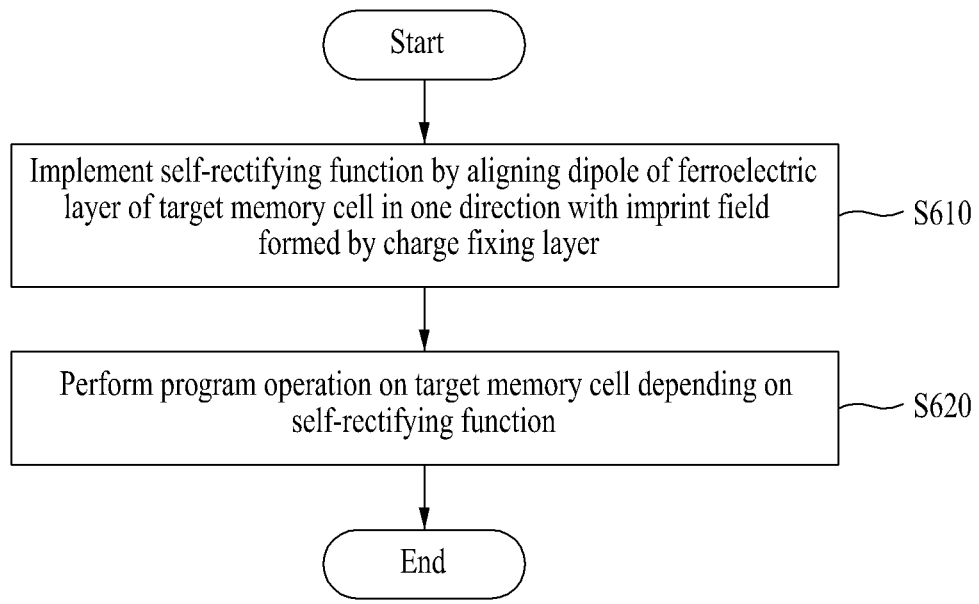
FIG. 6 is a flowchart illustrating a program operating method of a 3D non-volatile memory, according to an embodiment.

FIG. 6 is a flowchart illustrating a program operating method of a 3D non-volatile memory, according to an embodiment. It is assumed that a program operating method described below is performed by the 3D non-volatile memory described with reference to FIGS. 4A, 5A, and 5B. Furthermore, among memory cells formed by the ferroelectric layer FE of each of the horizontal structures HS described below, a word line corresponding to a target memory cell that is the target of a program operation refers to a selected word line (sel WL), and a bit line corresponding to the target memory cell refers to a selected bit line (sel BL) including the target memory cell. On the other hand, word lines other than the selected word line (sel WL) from among the word lines WL0-$n$ refer to unselected word lines (unsel WLs). Bit lines (the remaining bit lines other than the selected bit line (sel BL)), which do not include the target memory cell, from among the bit lines BL0-$n$ refer to unselected bit lines (unsel BLs).

Referring to FIG. 6, in operation S610, the 3D non-volatile memory may implement a self-rectifying function by aligning a dipole of the ferroelectric layer of a target memory cell in one direction with the imprint field formed by the charge fixing layer FCL.

Accordingly, in operation S620, the 3D non-volatile memory may perform the program operation on the target memory cell depending on the self-rectifying function.

The 3D non-volatile memory may perform the program operation on the target memory cell by aligning the dipole of the ferroelectric layer FE in the positive voltage direction or a negative voltage direction, thereby solving a new problem of the conventional FTJ memory (the operating voltage is significantly applied to the selector and diode when a selector or diode is included, thereby increasing an operating voltage and reducing the degree of integration).

With regard to details of the program operation described above, when the self-rectifying function of aligning the dipole of the ferroelectric layer FE in the positive voltage direction is implemented, an operation of writing binary data of "0" and an operation of writing binary data of "1" may be performed by applying voltages as shown in Table 1 below to the selected word lines (sel WL), the unselected word lines (unsel WLs), the selected bit lines (sel BL), and the unselected bit lines (unsel BLs), respectively.

TABLE 1

|  | Write "0" | Write "1" | Read |
| --- | --- | --- | --- |
| sel WL | GND (0 V) | $V_{set}$ | $V_{read}$ |
| unsel WLs | $2V_{reset}/3$ | Floating | $V_{read}/3$ |
| sel BL | $V_{reset}$ | GND (0 V) | GND |
| unsel BLs | Floating | $2V_{set}/3$ | $2V_{read}/3$ |

When the self-rectifying function of aligning the dipole of the ferroelectric layer FE in the negative voltage direction is implemented, the operation of writing binary data of "0" and the operation of writing binary data of "1" may be performed by applying voltages as shown in Table 2 below to the selected word lines (sel WL), the unselected word lines (unsel WLs), the selected bit lines (sel BL), and the unselected bit lines (unsel BLs), respectively.

TABLE 2

|  | Write "0" | Write "1" | Read |
| --- | --- | --- | --- |
| sel WL | $V_{reset}$ | GND (0 V) | $V_{read}$ |
| unsel WLs | Floating | $2V_{set}/3$ | $V_{read}/3$ |

TABLE 2-continued

|  | Write "0" | Write "1" | Read |
|---|---|---|---|
| sel BL | GND (0 V) | $V_{set}$ | GND |
| unsel BLs | $2V_{reset}/3$ | Floating | $2V_{read}/3$ |

The program operation is described above. However, when the self-rectifying function of aligning the dipole of the ferroelectric layer FE in the positive voltage direction is implemented, a read operation may be performed by applying voltages as shown in Table 1 below to the selected word lines (sel WL), the unselected word lines (unsel WLs), the selected bit lines (sel BL), and the unselected bit lines (unsel BLs), respectively. When the self-rectifying function of aligning the dipole of the ferroelectric layer FE in the negative voltage direction is implemented, the read operation may be performed by applying voltages as shown in Table 2 below to the selected word lines (sel WL), the unselected word lines (unsel WLs), the selected bit lines (sel BL), and the unselected bit lines (unsel BLs), respectively.

Figure 7:
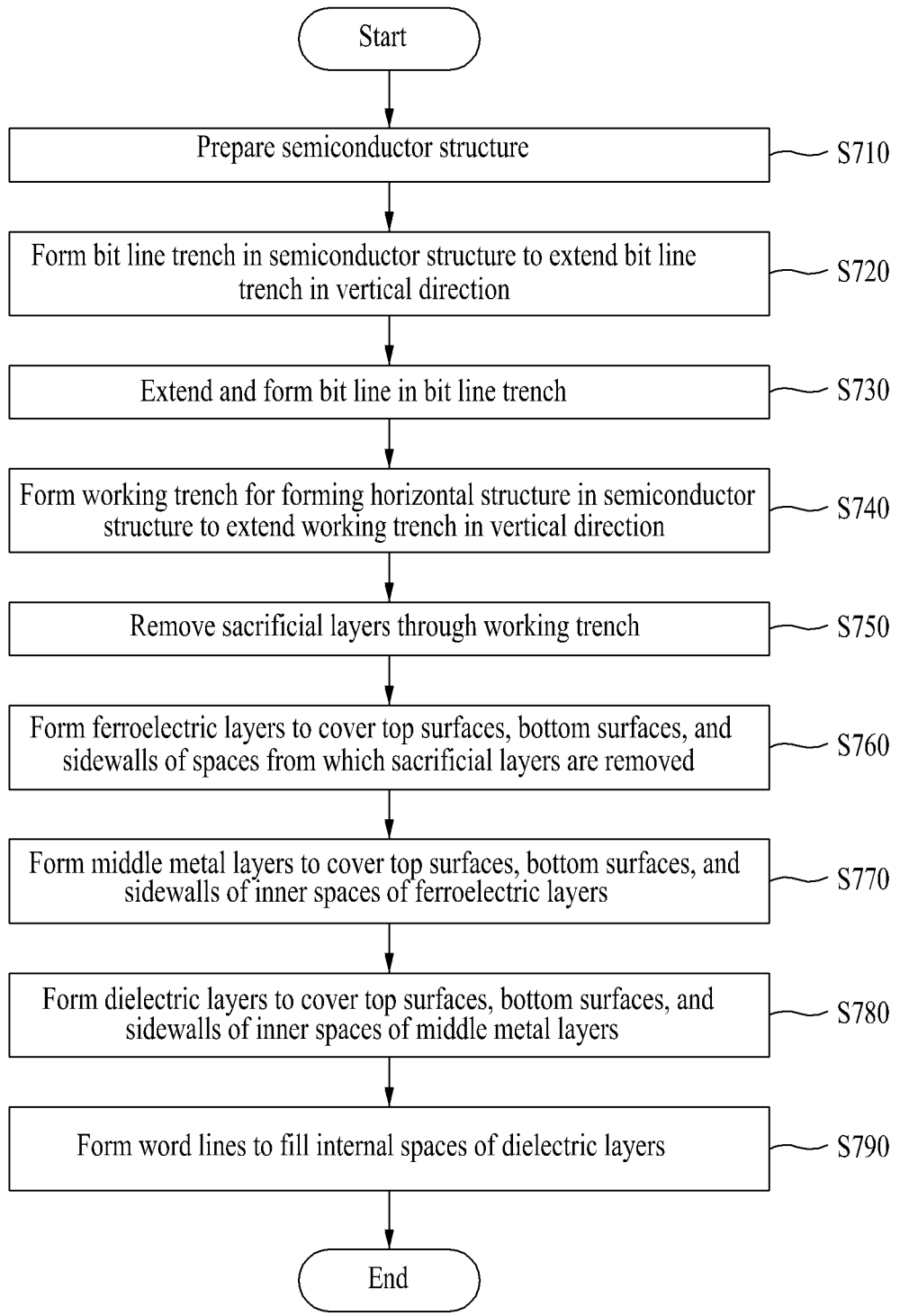
FIG. 7 is a flowchart illustrating a method of manufacturing a 3D non-volatile memory, according to an embodiment.

FIG. 7 is a flowchart illustrating a method of manufacturing a 3D non-volatile memory, according to an embodiment. FIGS. 8 to 18B are front cross-sectional views for describing a method of manufacturing the 3D non-volatile memory shown in FIG. 7.

Hereinafter, a manufacturing method may be performed by an automated and mechanized manufacturing system. The 3D non-volatile memory described with reference to FIGS. 2A and 2B may be obtained by performing the manufacturing method.

Figure 8:
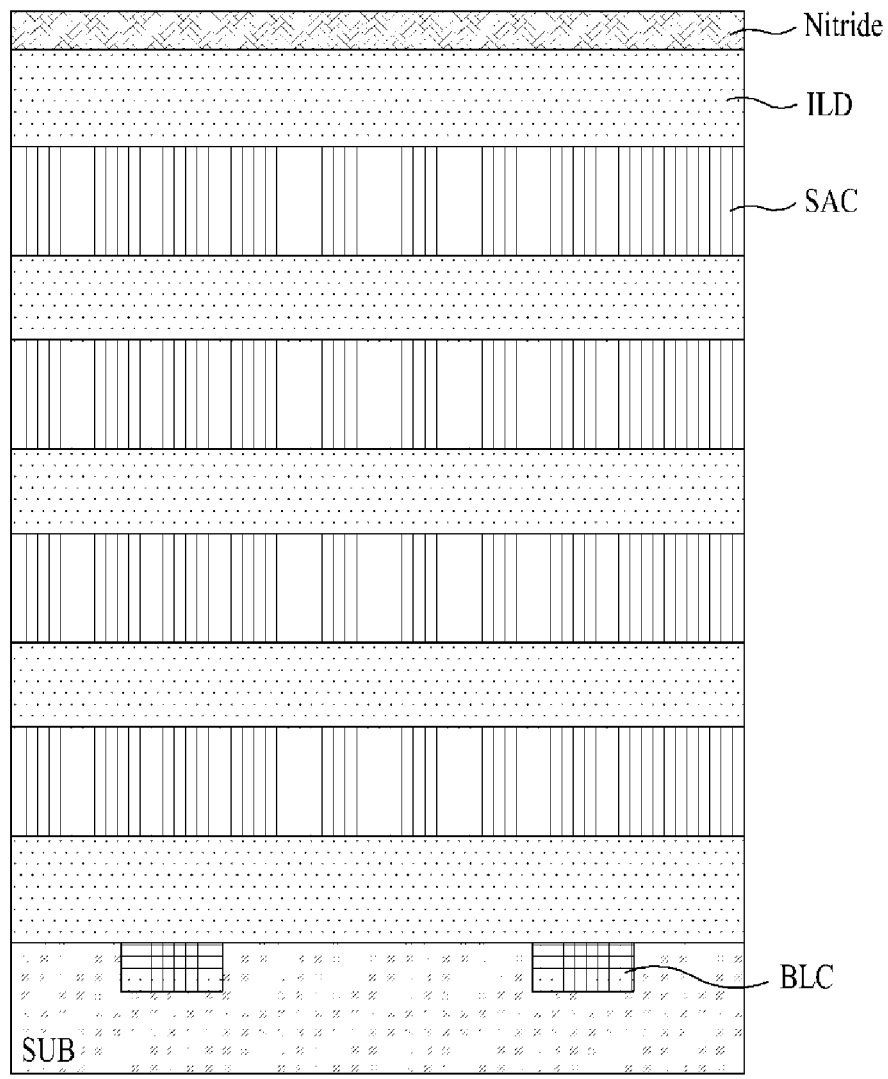
FIGS. 8 to 18B are front cross-sectional views for describing a method of manufacturing the 3D non-volatile memory shown in FIG. 7.

As shown in FIG. 8, in operation S710, the manufacturing system may prepare a semiconductor structure SEMI-STR including the interlayer insulating layers ILD and sacrificial layers SAC that are formed to extend in a horizontal direction (e.g., the first direction D1 and the second direction D2) on the substrate SUB and alternately stacked in a vertical direction (e.g., the third direction D3).

The substrate SUB may be a semiconductor substrate such as a silicon substrate, a silicon-germanium substrate, a germanium substrate, or a monocrystalline epitaxial layer grown on a monocrystalline silicon substrate. A bit line contact BLC may be formed in a region corresponding to a location of the bit line BLn in the substrate SUB.

Moreover, a nitride layer for protecting the semiconductor structure SEMI-STR may be disposed on the top surface of the semiconductor structure SEMI-STR.

At this time, a thickness of each of the sacrificial layers SAC may be adjusted in consideration of areas where the ferroelectric layers FE respectively contact the middle metal layers MM and areas where the dielectric layers DE respectively contact the word lines WL0-n. In more detail, the areas where the ferroelectric layers FE respectively contact the middle metal layers MM and the areas where the dielectric layers DE respectively contact the word lines WL0-n need be adjusted and determined to satisfy the condition that the capacitance $C_{FE}$ of each of the ferroelectric layers FE is smaller than the capacitance $C_{DE}$ of each of the dielectric layers DE. Accordingly, the thickness of each of the ferroelectric layers FE, the thickness of each of the metal layers MM, the thickness of each of the dielectric layers DE, and the thickness of each of the sacrificial layers SAC on which the word lines WL0-n are to be formed may be determined in consideration of the condition.

Figure 9:
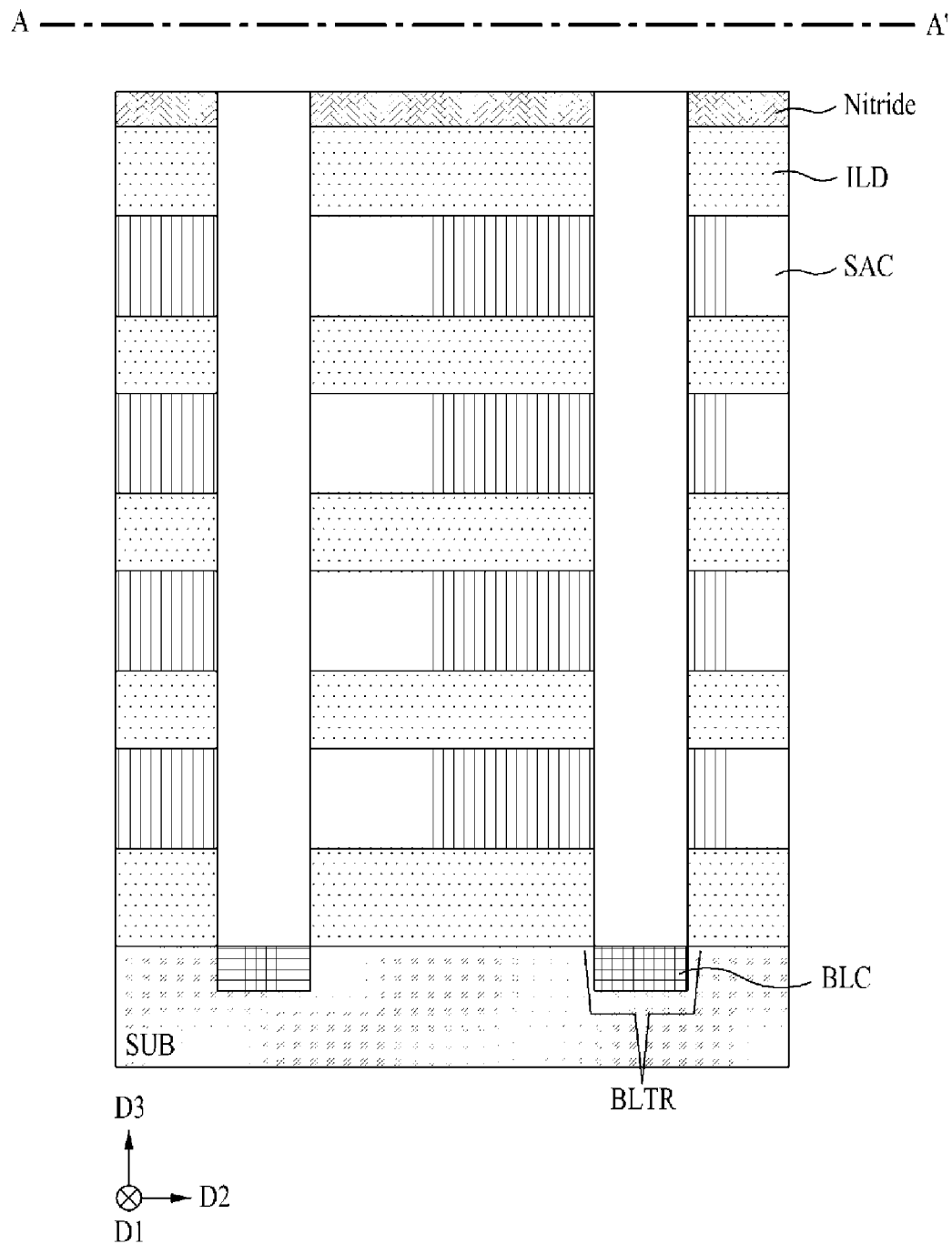

In operation S720, as shown in FIG. 9, the manufacturing system may form the bit line trench BLTR in the semiconductor structure SEMI-STR to extend the bit line trench BLTR in the vertical direction (e.g., the third direction D3). The manufacturing system may form the bit line trench BLTR in a region corresponding to a location of a bit line contact BLC formed in the semiconductor structure SEMI-STR to extend the bit line trench BLTR. Operation S720 of forming the bit line trench BLTR may be subdivided into a first operation of forming a mask pattern MASK on the semiconductor structure SEMI-STR and a second step of performing an anisotropic etching process by using a mask pattern as an etching mask and may be performed. However, this is only an example, and various etching processes may be used in operation S720.

Figure 10:
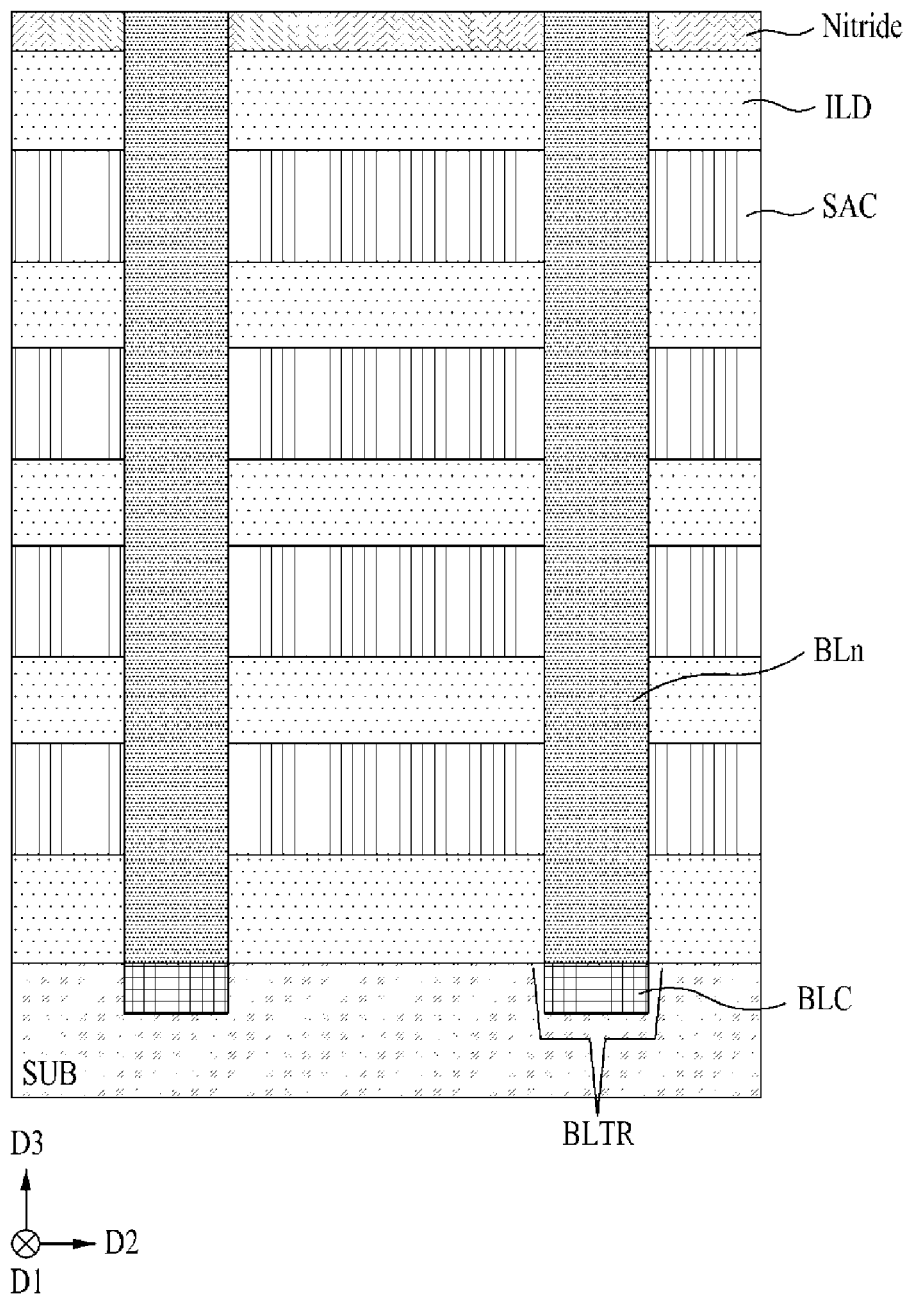

In operation S730, as shown in FIG. 10, the manufacturing system may form the bit line BLn in the bit line trench BLTR to extend the bit line BLn. For example, the manufacturing system may extend and form the bit line BLn with a conductive material (e.g., a conductive material including at least one selected from a doped semiconductor (e.g., doped silicon), metal (e.g., tungsten W, copper Cu, aluminum Al, titanium Ti, tantalum Ta, molybdenum Mo, ruthenium Ru, gold Au, or the like), or conductive metal nitride (e.g., titanium nitride, tantalum nitride, or the like). In operation S730 of extending and forming the bit line BLn, various processes of filling the conductive material in the bit line trench BLTR may be used.

Figure 11:
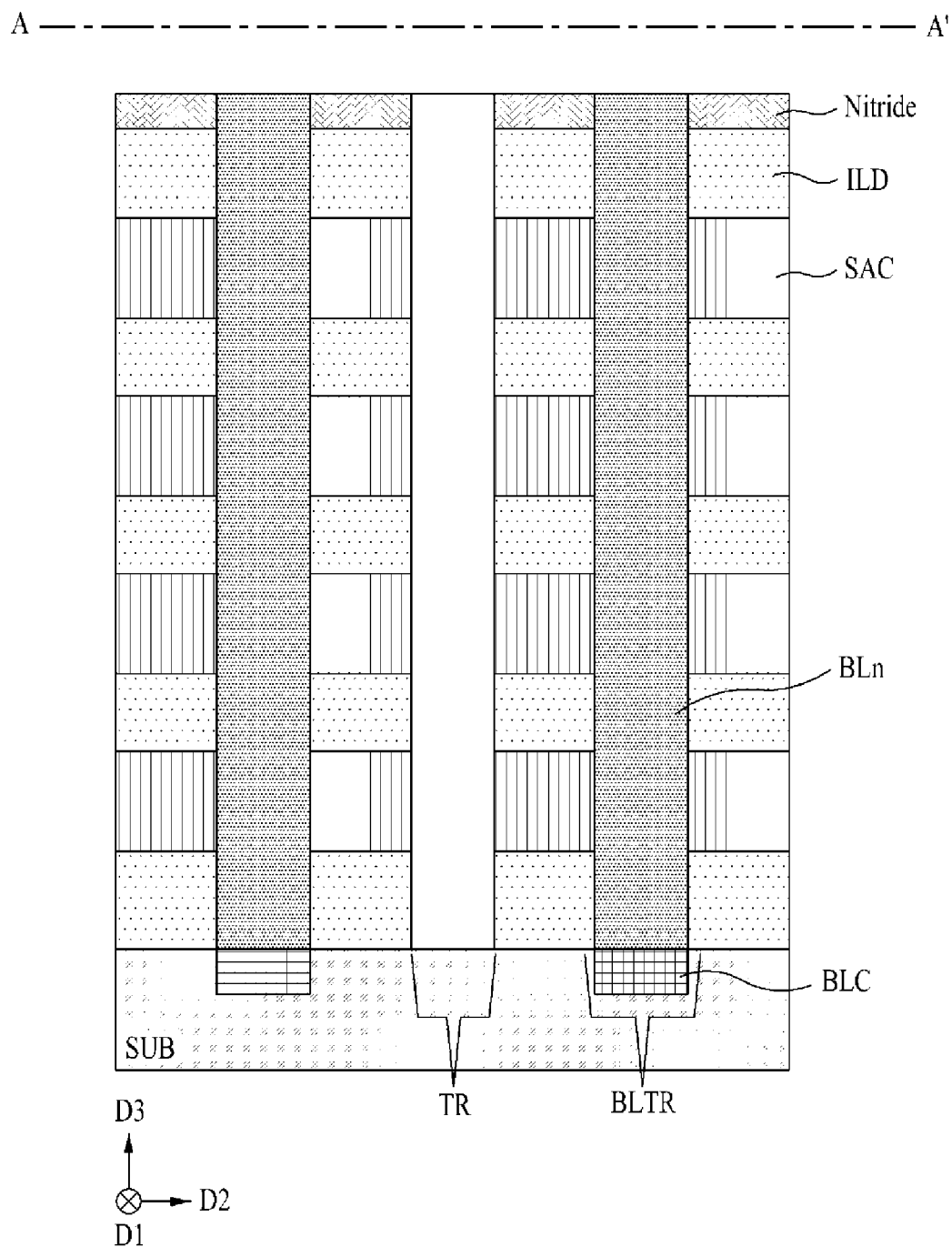

In operation S740, as shown in FIG. 11, the manufacturing system may form a working trench TR for forming a horizontal structure in the semiconductor structure SEMI-STR to extend the working trench TR in the vertical direction (e.g., the third direction D3). In operation S740 of forming the working trench TR, various etching processes such as anisotropic etching may be used similarly to the process of forming the bit line trench BLTR.

However, the manufacturing method may omit operation S740. In this case, operation S750 to operation S790 to be described later need be performed through the bit line trench BLTR, and thus operation S730 needs be finally performed after operation S790.

Figure 12:
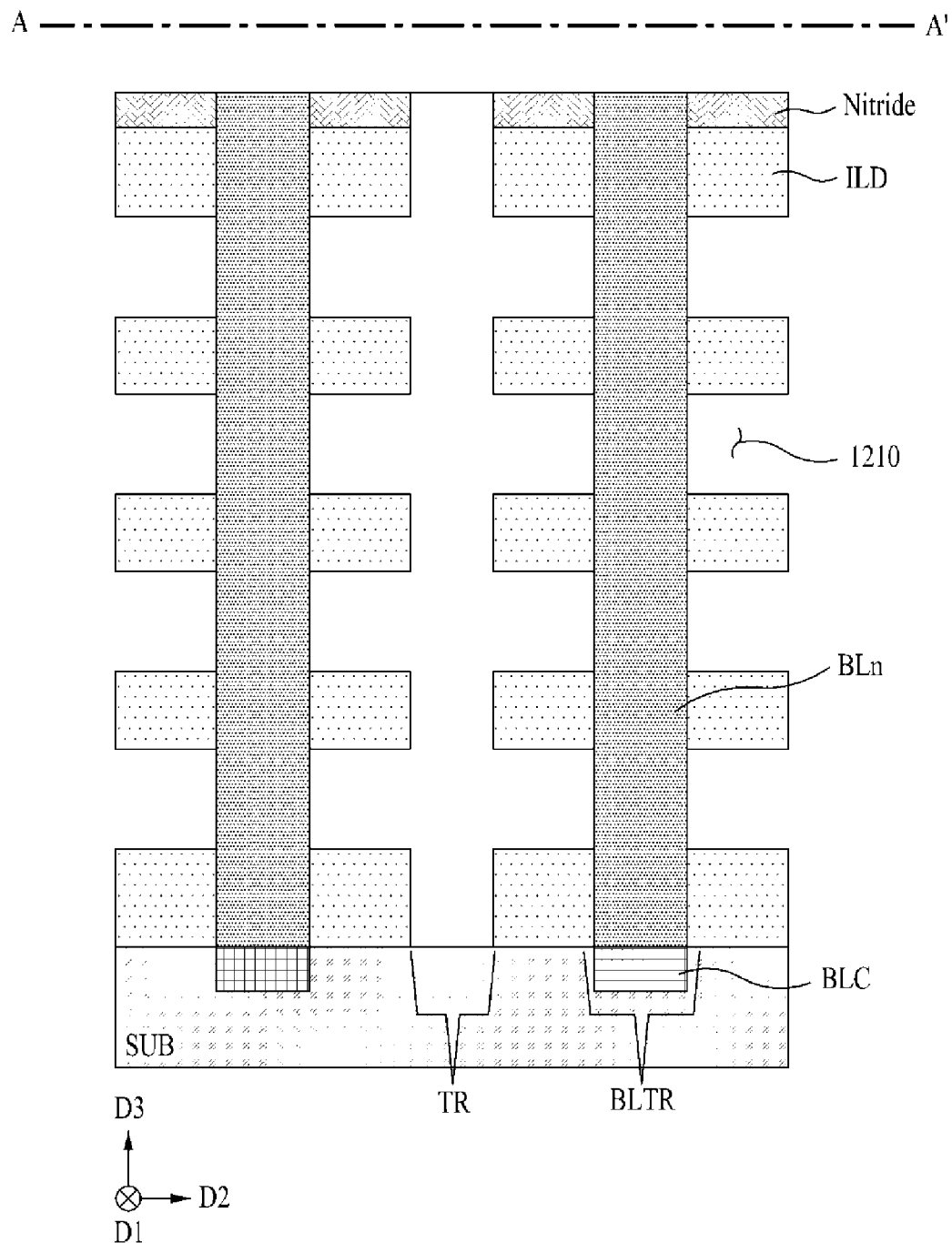

In operation S750, the manufacturing system may remove the sacrificial layers SAC through the working trench TR as shown in FIG. 12. In operation S750 of removing the sacrificial layers SAC, various etching processes through the working trench TR in the horizontal direction may be used. However, an etching process of completely etching only the sacrificial layers SAC may be used without etching the interlayer insulating layers ILD during the etching process in the horizontal direction.

Figure 13:
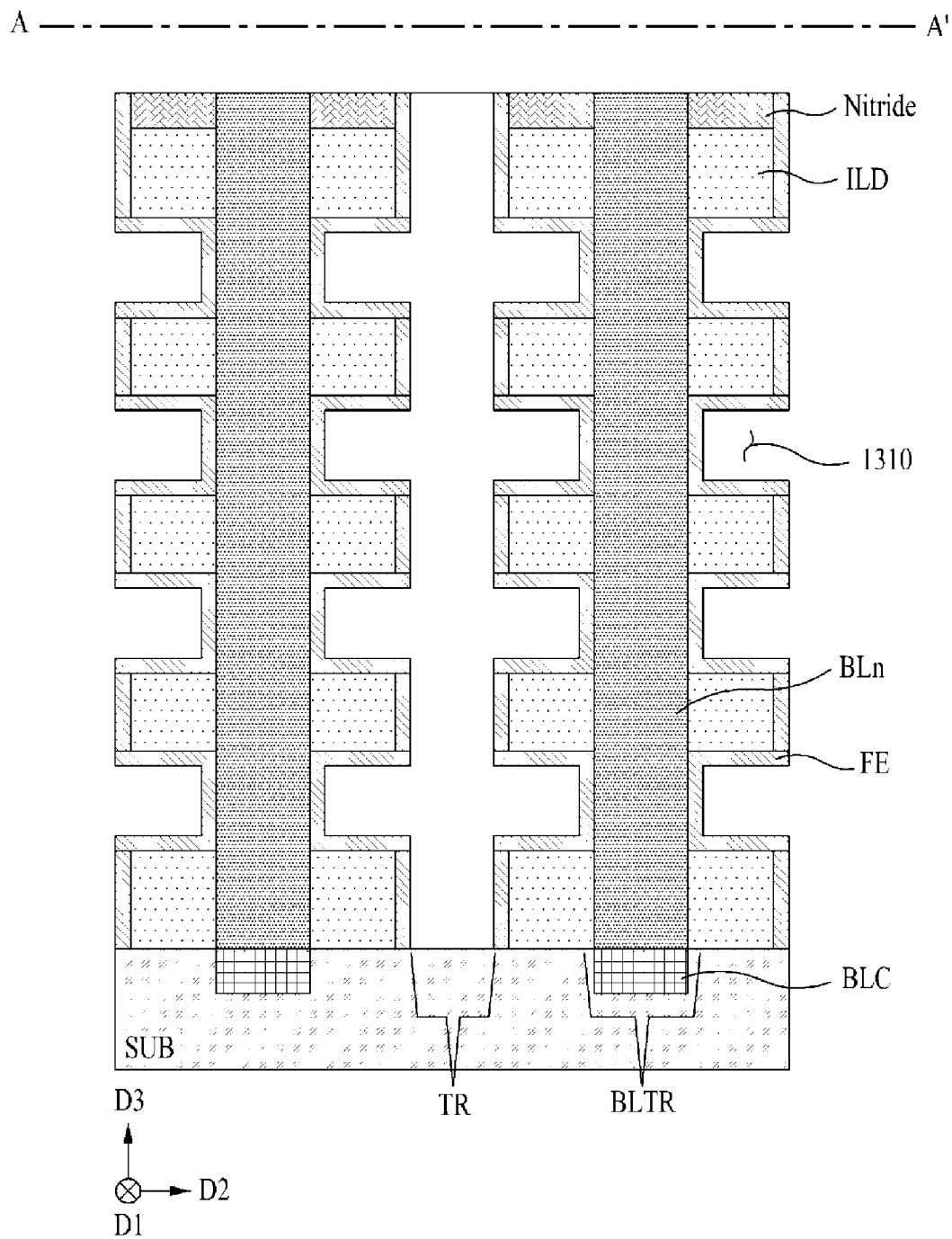

In operation S760, as shown in FIG. 13, the manufacturing system may form the ferroelectric layers FE to cover top surfaces, bottom surfaces, and sidewalls of spaces 1210 from which the sacrificial layers SAC are removed. For example, the manufacturing system may deposit the ferroelectric layers FE on top surfaces, bottom surfaces, and sidewalls of the spaces 1210 with a material (HfOx, HfOx doped with at least one material of Al, Zr, or Si, PZT(Pb(Zr, Ti)O$_3$), PTO(PbTiO$_3$), SBT(SrBi$_2$Ti2O$_3$), BLT(Bi(La, Ti)O$_3$), PLZT(Pb(La, Zr)TiO$_3$), BST(Bi(Sr, Ti)O$_3$), barium titanate (BaTiO$_3$), P(VDF-TrFE), PVDF, AlOx, ZnOx, TiOx, TaOx, or InOx) having an orthorhombic crystal structure in which polarization occurs by an applied voltage. Various deposition processes may be used for deposition of the ferroelectric layers FE.

Figure 14:
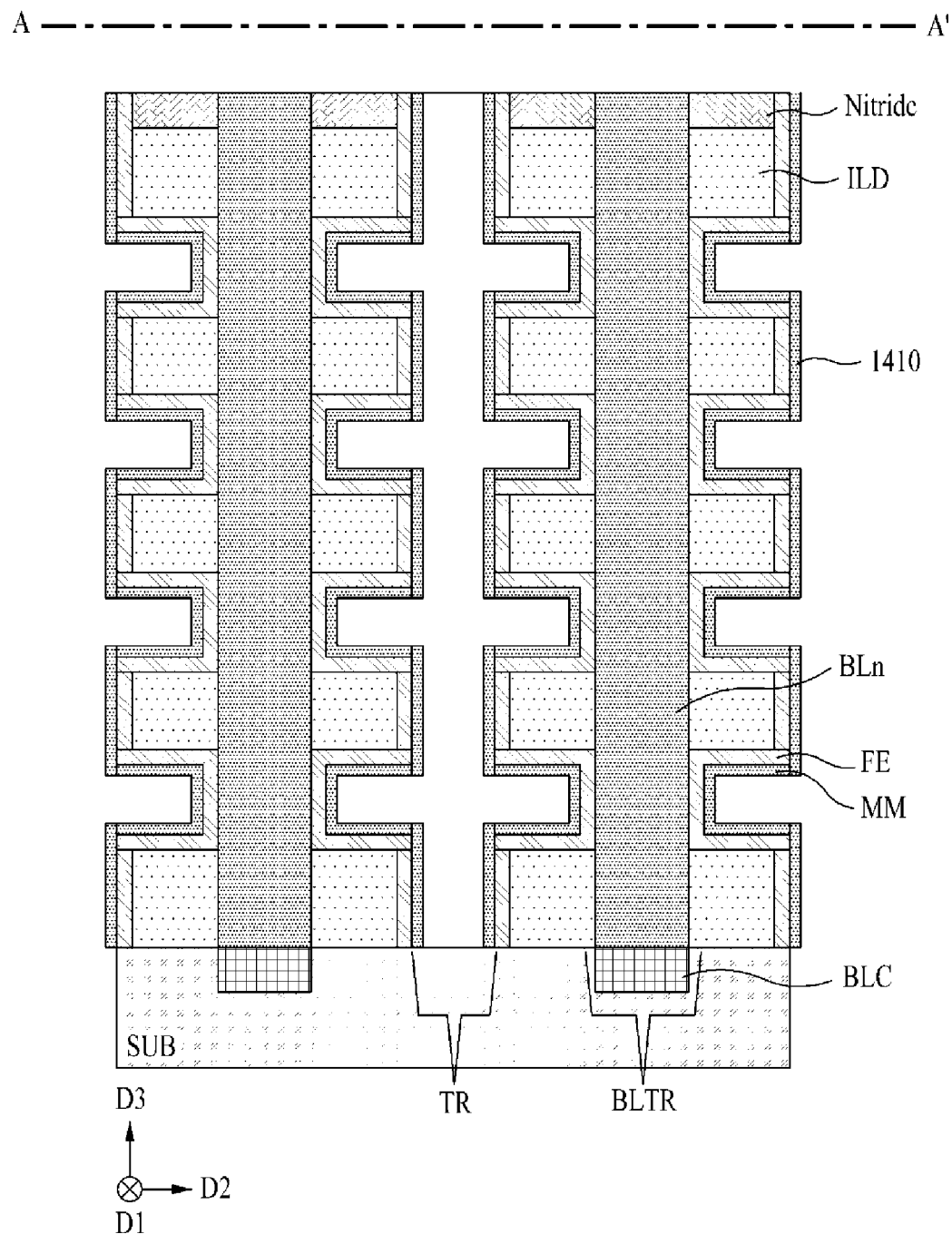

In operation S770, as shown in FIG. 14, the manufacturing system may form the middle metal layers MM to cover a top surface, a bottom surface, and a sidewall of inner spaces 1310 of the ferroelectric layers FE. For example, the manufacturing system may deposit the middle metal layers MM on the top surface, bottom surface, and sidewall of the spaces 1310 by using a conductive material (e.g., a conductive material including at least one selected from a doped semiconductor (e.g., doped silicon), metal (e.g., tungsten W, copper Cu, aluminum Al, titanium Ti, tantalum Ta, molybdenum Mo, ruthenium Ru, gold Au, or the like), or conductive metal nitride (e.g., titanium nitride, tantalum nitride, or the like). Various deposition processes may be used for deposition of the middle metal layers MM.

Figure 15:
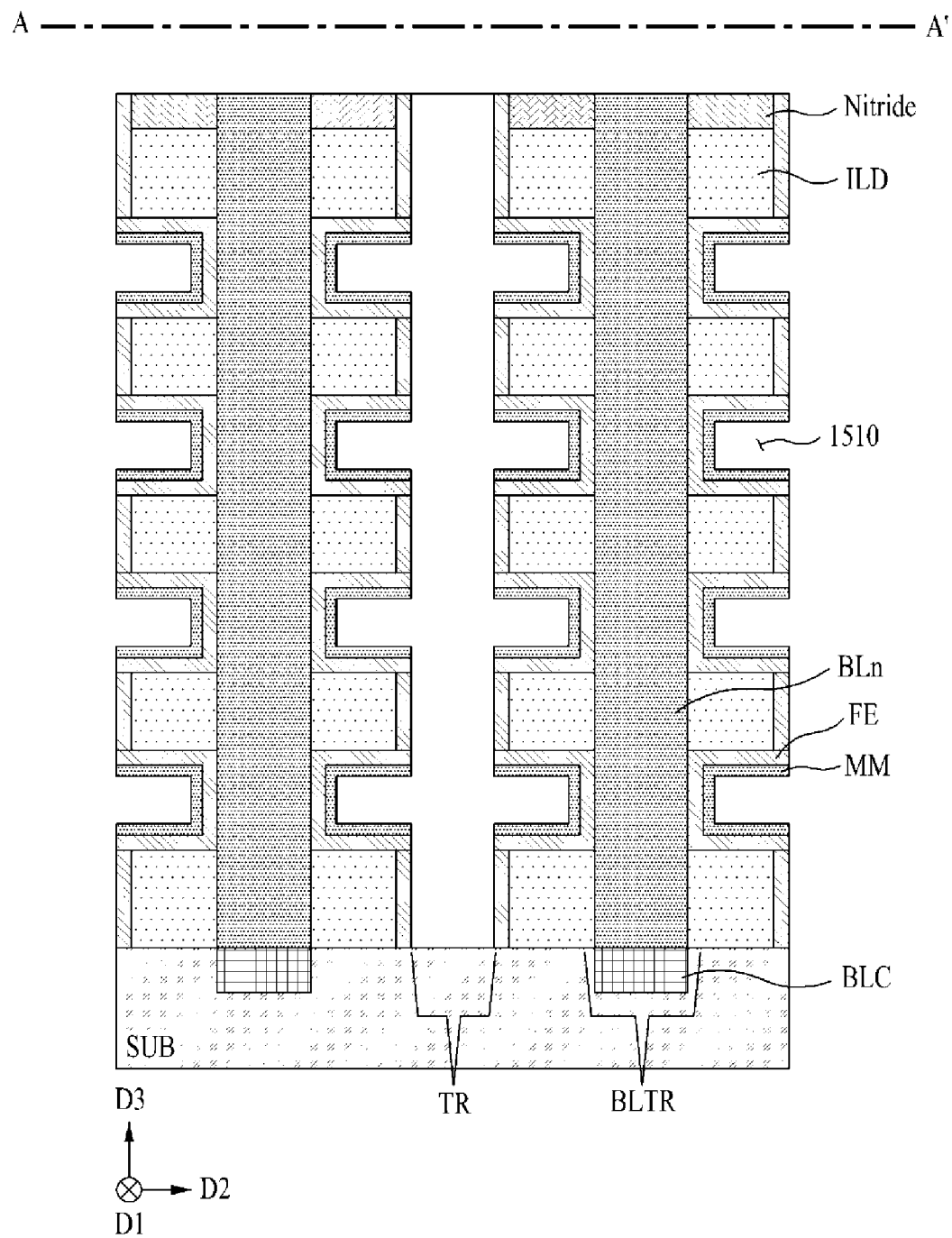

Although not shown as a separate operation in FIG. 7, between operation S770 and operation S780, as shown in FIG. 15, the manufacturing system may remove the middle metal layers MM formed in the remaining region 1410 other than the protruding region among the entire region of the working trench TR.

Figure 16:
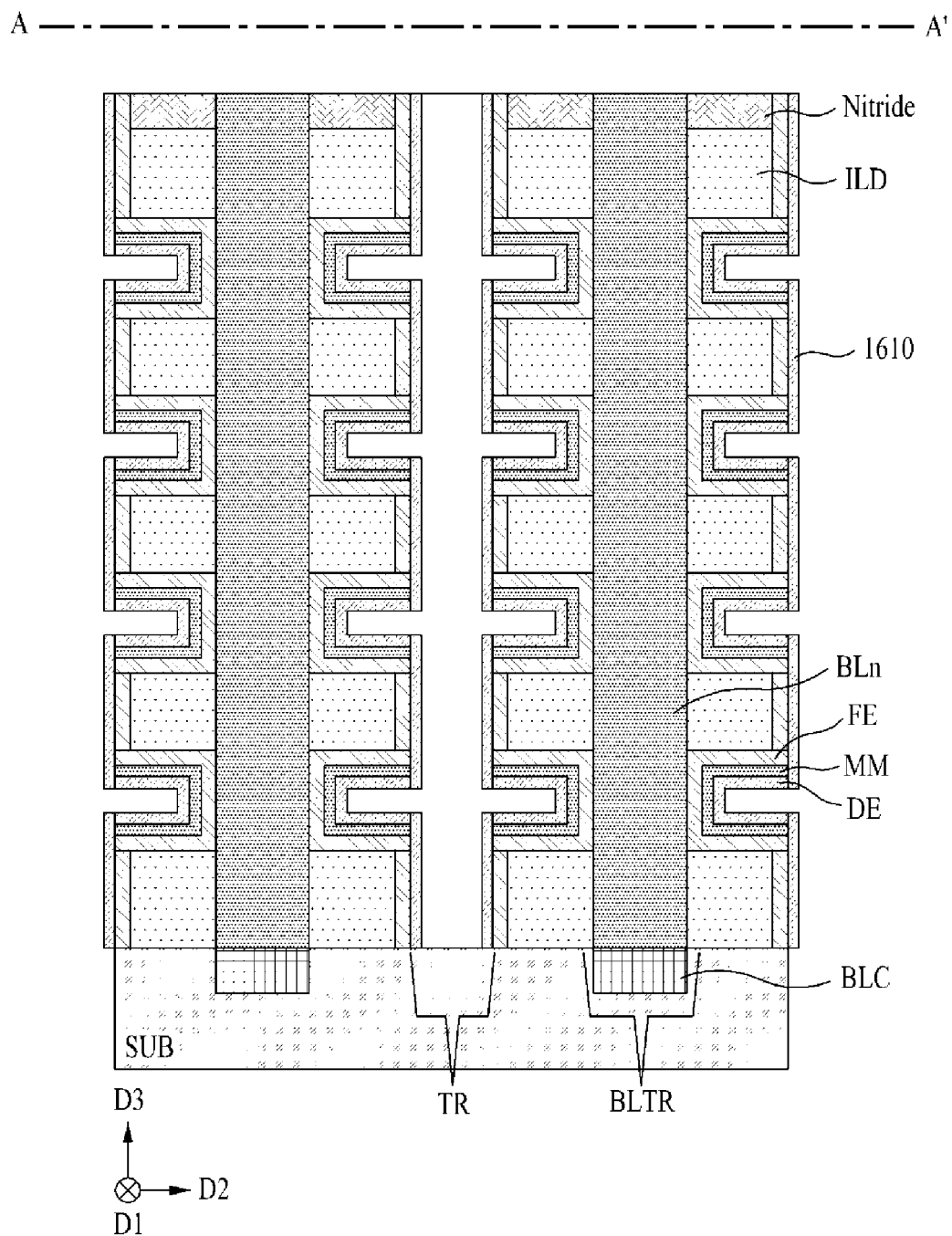
Figure 17:
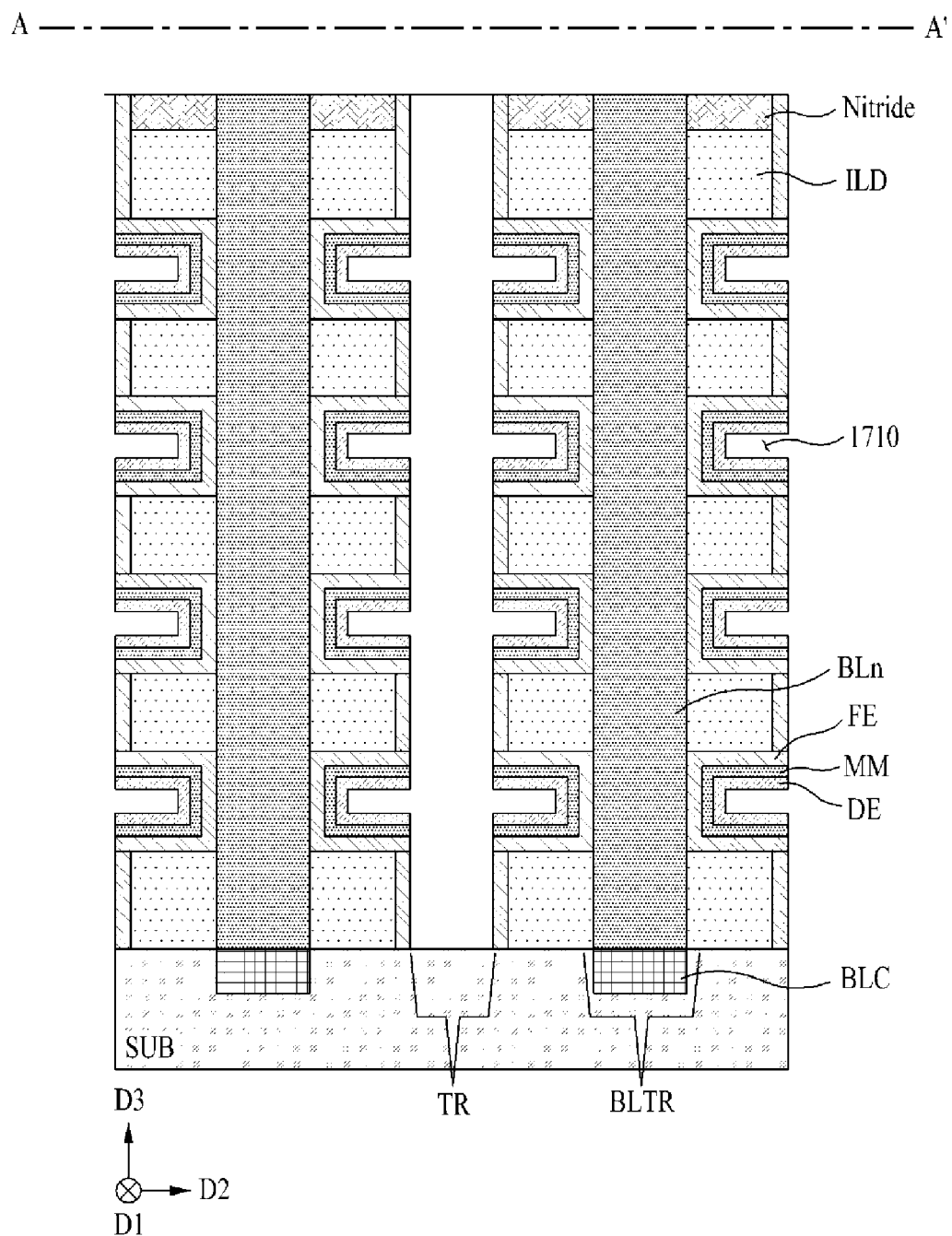

In operation S780, as shown in FIGS. 16 and 17, the manufacturing system may form the dielectric layers DE to cover top surfaces, bottom surfaces, and sidewalls of inner spaces 1510 of the middle metal layers MM. For example, the manufacturing system may deposit the dielectric layers DE on the top surfaces, bottom surfaces, and sidewalls of the spaces 1510 with at least one material of a silicon oxide film, a nitride film, an aluminum oxide film, a hafnium oxide film, a silicon-doped hafnium oxide (Si:$HfO_2$) film, an aluminum-doped hafnium oxide (Al:$HfO_2$) film, a lanthanum-doped hafnium oxide (La:$HfO_2$) film, a yttrium-doped hafnium oxide (Y:$HfO_2$) film, a strontium-doped hafnium oxide (Sr:$HfO_2$) film, a hafnium oxynitride film, a zinc oxide film, a lanthanum oxide film, and a hafnium silicon oxide film, a hafnium zirconium oxide film, a barium titanate ($BaTiO_3$) film, a lead titanate ($PbTiO_3$) film, a calcium titanate ($CaTiO_3$) film, a potassium niobate ($KNbO_3$) film, a lead zirconate titanate (PZT) film, a $SrBi_2Ta_2O_9$ film, or a bismuth ferrite (BFO) film. Various deposition processes may be used for deposition of the dielectric layers DE.

At this time, in operation S780, as shown in FIGS. 16 and 17, the manufacturing system may remove the dielectric layers DE formed in the remaining region 1610 other than the protruding region among the entire region of the working trench TR.

Figure 18A:
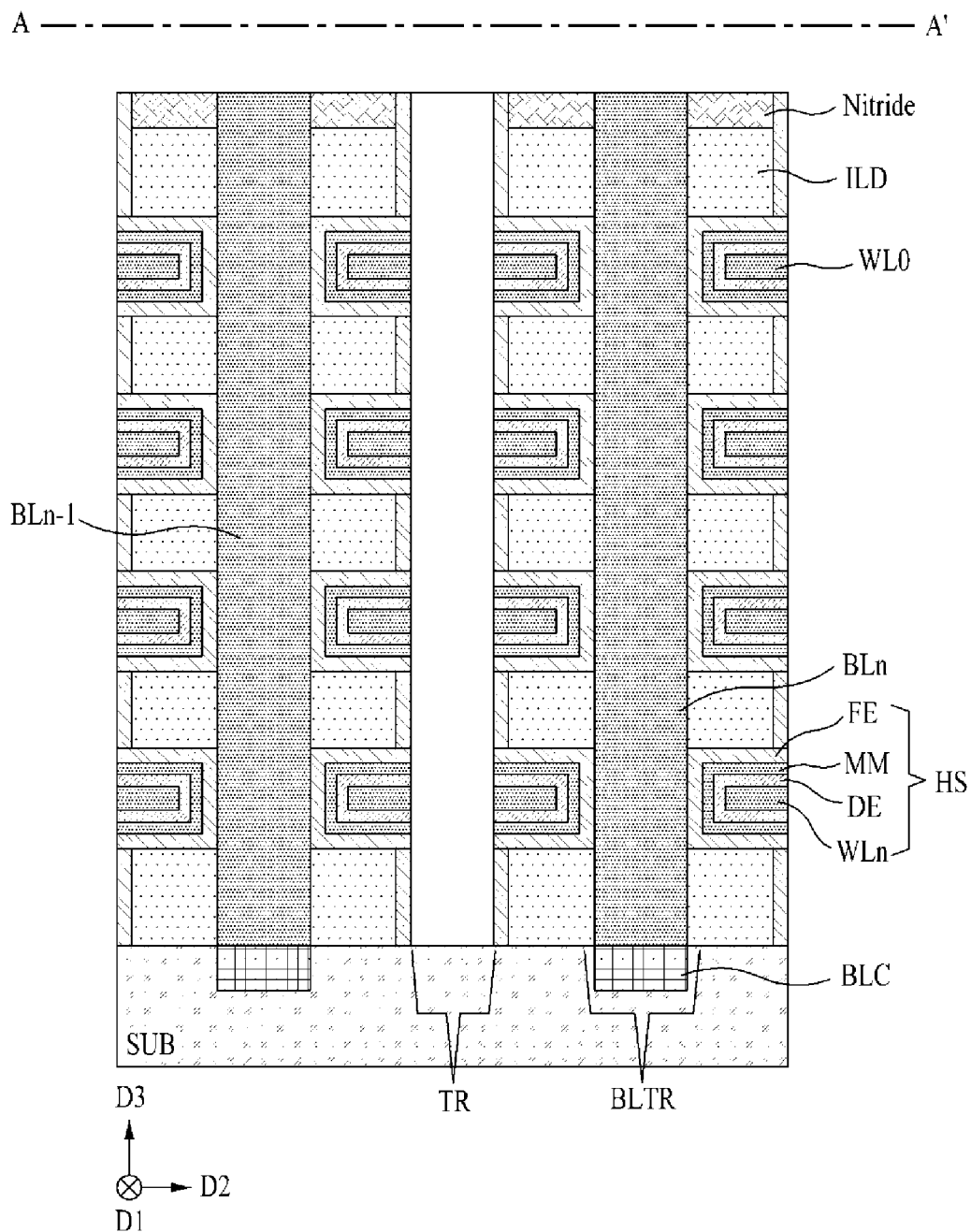
Figure 18B:
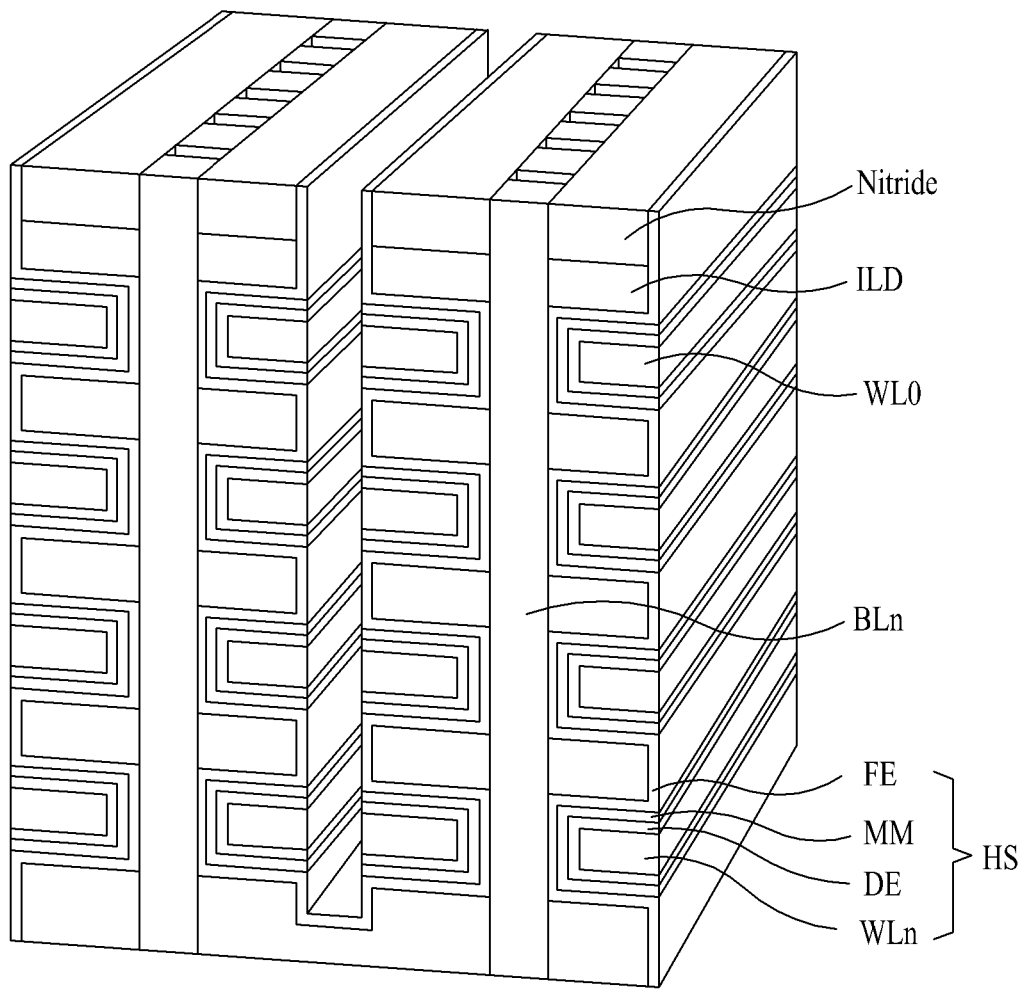

In operation S790, the manufacturing system may form the word lines WL0-*n* to fill internal spaces 1710 of the dielectric layers DE, as shown in FIGS. 18A to 18B. For example, the manufacturing system may fill the word lines WL0-*n* into the interior spaces 1710 with a conductive material (e.g., a conductive material including at least one selected from a doped semiconductor (e.g., doped silicon), metal (e.g., tungsten W, copper Cu, aluminum Al, titanium Ti, tantalum Ta, molybdenum Mo, ruthenium Ru, gold Au, or the like), or conductive metal nitride (e.g., titanium nitride, tantalum nitride, or the like). In operation S790 of forming the word lines WL0-*n*, various processes for filling the conductive material in the internal spaces 1710 may be used.

As described above, the manufacturing method of the 3D non-volatile memory described with reference to FIGS. 2A and 2B has been described. However, while including the same operations, the 3D non-volatile memory described with reference to FIGS. 4A, 5A to 5B may be manufactured by additionally performing an operation of forming the charge fixing layer FCL for implementing a self-rectifying function by forming an imprint field.

In more detail, between operation S710 and operation S790 described above, the 3D non-volatile memory including the charge fixing layer FCL may be manufactured by performing one of an operation of forming the charge fixing layer FCL to cover the sidewalls of the spaces 1210 from which the sacrificial layers SAC are removed, an operation of forming the charge fixing layer FCL to cover the sidewalls of the inner spaces 1310 of the ferroelectric layers FE, an operation of forming the charge fixing layer FCL to cover the sidewalls of the inner spaces 1510 of the middle metal layers MM, or an operation of forming the charge fixing layer FCL to cover the sidewalls of the inner spaces 1710 of the dielectric layers DE.

For example, when the operation of forming the charge fixing layer FCL to cover the sidewalls of the spaces 1210 from which the sacrificial layers SAC is removed is performed, the corresponding operation may be performed between operation S750 and operation S760. In operation S760, the manufacturing system may form the ferroelectric layers FE to cover top surfaces and bottom surfaces of the spaces 1210, from which the sacrificial layers SAC are removed, and sidewalls of the charge fixing layer FCL. The 3D non-volatile memory manufactured in this way has a structure in which the charge fixing layer FCL is interposed between each of the ferroelectric layers FE and the bit line BL*n*.

As another example, when the operation of forming the charge fixing layer FCL to cover the sidewalls of the inner spaces 1310 of the ferroelectric layers FE is performed, the corresponding operation may be performed between operation S760 and operation S770. In operation S770, the manufacturing system may form the middle metal layers MM to cover the top surfaces and bottom surfaces of the spaces 1310 of the ferroelectric layers FE, and sidewalls of the charge fixing layer FCL. The 3D non-volatile memory manufactured in this way has a structure of FIG. 4A in which the charge fixing layer FCL is interposed between each of the ferroelectric layers FE and each of the middle metal layers MM.

As another example, when the operation of forming the charge fixing layer FCL to cover the sidewalls of the inner spaces 1510 of the middle metal layers MM is performed, the corresponding operation may be performed between operation S770 and operation S780. In operation S780, the manufacturing system may form the dielectric layers DE to cover the top surfaces and bottom surfaces of the spaces 1510 of the middle metal layers MM, and sidewalls of the charge fixing layer FCL. The 3D non-volatile memory manufactured in this way has a structure in which the charge fixing layer FCL is interposed between each of the middle metal layers MM and each of the dielectric layers DE.

As another example, when the operation of forming the charge fixing layer FCL to cover the sidewalls of the inner spaces 1710 of the dielectric layers DE is performed, the corresponding operation may be performed between operation S780 and operation S790. In operation S790, the manufacturing system may form the word lines WL0-*n* to cover top surfaces and bottom surfaces of the spaces 1710 of the dielectric layers DE, and sidewalls of the charge fixing layer FCL. The 3D non-volatile memory manufactured in this way has a structure in which the charge fixing layer FCL is interposed between each of the dielectric layers DE and the word lines WL0-*n*.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

Embodiments may propose a 3D non-volatile memory having a structure including a charge fixing layer implementing a self-rectifying function, an operating method thereof, and a manufacturing method thereof.

Accordingly, one embodiment may achieve technical effects of improving integration and operating voltage, simplifying a process, and improving durability.

Moreover, embodiments of the present disclosure provide a 3D non-volatile memory having a structure in which an area where a ferroelectric layer contacts a middle metal layer and an area where a dielectric layer contacts a word line are adjusted to satisfy the condition that capacitance of a ferroelectric layer is smaller than capacitance of a dielectric layer.

Accordingly, embodiments may achieve technical effects of improving memory reliability.

However, the effects of the present disclosure are not limited to the effects, and may be variously expanded without departing from the spirit and scope of the present disclosure.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A three-dimensional (3D) non-volatile memory comprising:
    a bit line formed to extend in a vertical direction; and
    horizontal structures contacting the bit line while being formed to extend in a horizontal direction and being space in the vertical direction, wherein each of the horizontal structures includes a ferroelectric layer contacting the bit line, a middle metal layer surrounded by the ferroelectric layer, a dielectric layer surrounded by the middle metal layer, and a word line surrounded by the dielectric layer.

2. The 3D non-volatile memory of claim 1, further comprising:
    a charge fixing layer configured to implement a self-rectifying function by forming an imprint field while being positioned in one of a junction portion with the ferroelectric layer or a junction portion of the dielectric layer.

3. The 3D non-volatile memory of claim 2, wherein the charge fixing layer includes at least one of $SiO_2$, $SiN_x$, $Ta_2O_5$, $Nb_2O_5$, $HfO_2$, $ZrO_2$, $TiO_2$, or $V_2O_5$ when being formed to fix a positive charge.

4. The 3D non-volatile memory of claim 2, wherein the charge fixing layer includes at least one of $Al_2O_3$, AlN, $Ga_2O_3$, $TiO_2$, $Ta_2O_5$, $Nb_2O_5$, or $HfO_2$ when being formed to fix a negative charge.

5. The 3D non-volatile memory of claim 2, wherein the charge fixing layer is positioned on a junction portion where the ferroelectric layer contacts the bit line when the charge fixing layer aligns and shifts a dipole of the ferroelectric layer in a negative voltage direction while being formed to fix a positive charge.

6. The 3D non-volatile memory of claim 2, wherein the charge fixing layer is positioned on one of a junction portion where the ferroelectric layer contacts the middle metal layer, a junction portion where the dielectric layer contacts the middle metal layer, or a junction portion where the dielectric layer contacts the word line, when the charge fixing layer aligns and shifts a dipole of the ferroelectric layer in a negative voltage direction while being formed to fix a negative charge.

7. The 3D non-volatile memory of claim 2, wherein the charge fixing layer is positioned on one of a junction portion where the ferroelectric layer contacts the middle metal layer, a junction portion where the dielectric layer contacts the middle metal layer, or a junction portion where the dielectric layer contacts the word line, when the charge fixing layer aligns and shifts a dipole of the ferroelectric layer in a positive voltage direction while being formed to fix a positive charge.

8. The 3D non-volatile memory of claim 2, wherein the charge fixing layer is positioned on a junction portion where the ferroelectric layer contacts the bit line, when the charge fixing layer aligns and shifts a dipole of the ferroelectric layer in a positive voltage direction while being formed to fix a negative charge.

9. The 3D non-volatile memory of claim 1, wherein the bit line and the ferroelectric layer, and the dielectric layer and the word line have a structure that satisfies a condition that capacitance of the ferroelectric layer is smaller than capacitance of the dielectric layer.

10. The 3D non-volatile memory of claim 9, wherein an area where the ferroelectric layer contacts the middle metal layer and an area where the dielectric layer contacts the word line are adjusted to satisfy the condition that the capacitance of the ferroelectric layer is smaller than the capacitance of the dielectric layer.

11. The 3D non-volatile memory of claim 10, wherein the area where the ferroelectric layer contacts the middle metal layer and the area where the dielectric layer contacts the word line are adjusted independently of each other depending on a characteristic in which contacting the ferroelectric layer with the middle metal layer and contacting the dielectric layer with the word line do not structurally affect each other.

12. A program operating method of a 3D non-volatile memory including a bit line formed to extend in a vertical direction, horizontal structures contacting the bit line while being formed to extend in a horizontal direction and being space in the vertical direction, each of the horizontal structures including a ferroelectric layer contacting the bit line, a middle metal layer surrounded by the ferroelectric layer, a dielectric layer surrounded by the middle metal layer, and a word line surrounded by the dielectric layer, and a charge fixing layer positioned in one of a junction portion with the ferroelectric layer or a junction portion of the dielectric layer, the method comprising:
    implementing a self-rectifying function by aligning a dipole of the ferroelectric layer of a target memory cell in one direction with an imprint field formed by the charge fixing layer; and
    performing a program operation on the target memory cell depending on the self-rectifying function.

13. A method for manufacturing a 3D non-volatile memory, the method comprising:
    preparing a semiconductor structure including interlayer insulating layers and sacrificial layers that are formed to extend in a horizontal direction and alternately stacked in a vertical direction;
    forming a bit line trench in the semiconductor structure to extend the bit line trench in the vertical direction;
    forming and extending a bit line in the bit line trench;

forming a working trench for forming a horizontal structure in the semiconductor structure to extend the working trench in the vertical direction;

removing the sacrificial layers through the working trench;

forming ferroelectric layers to cover top surfaces, bottom surfaces, and sidewalls of spaces where the sacrificial layers are removed;

forming middle metal layers to cover top surfaces, bottom surfaces, and sidewalls of inner spaces of the ferroelectric layers;

forming dielectric layers to cover top surfaces, bottom surfaces, and sidewalls of inner spaces of the middle metal layers; and forming word lines to fill inner spaces of the dielectric layers.

14. The method of claim 13, further comprising one of:

forming a charge fixing layer for implementing a self-rectifying function by forming an imprint field to cover the sidewalls of the spaces from which the sacrificial layers are removed;

forming the charge fixing layer to cover the sidewalls of the inner spaces of the ferroelectric layers;

forming the charge fixing layer to cover the sidewalls of the inner spaces of the middle metal layers; or forming the charge fixing layer to cover the sidewalls of the inner spaces of the dielectric layers.

15. A 3D non-volatile memory comprising:

a bit line formed to extend in one direction;

ferroelectric layers that are in contact with the bit line;

middle metal layers that are in contact with the ferroelectric layers, respectively;

dielectric layers that are in contact with the middle metal layers, respectively; and word lines that are in contact with the dielectric layers, respectively.

16. The 3D non-volatile memory of claim 15, wherein the bit line and the ferroelectric layers, and the dielectric layers and the word lines have a structure for satisfying a condition that capacitance of each of the ferroelectric layers is smaller than capacitance of each of the dielectric layers.

17. The 3D non-volatile memory of claim 16, wherein areas where the ferroelectric layers respectively contact the middle metal layers and areas where the dielectric layers respectively contact the word lines are adjusted to satisfy the condition that the capacitance of each of the ferroelectric layers is smaller than the capacitance of each of the dielectric layers.

18. The 3D non-volatile memory of claim 17, wherein the areas where the ferroelectric layers respectively contact the middle metal layers and the areas where the dielectric layers respectively contact the word lines are adjusted independently of each other depending on a characteristic in which respectively contacting the ferroelectric layers with the middle metal layers and respectively contacting the dielectric layers with the word lines do not structurally affect each other.

* * * * *